United States Patent
Oe

(10) Patent No.: US 6,374,986 B1
(45) Date of Patent: Apr. 23, 2002

(54) OBJECT SUPPLYING APPARATUS

(75) Inventor: Kunio Oe, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 33 days.

(21) Appl. No.: 09/593,801

(22) Filed: Jun. 15, 2000

(30) Foreign Application Priority Data

Jul. 23, 1999 (JP) ........................................... 11-209402

(51) Int. Cl.[7] .............................................. B65G 47/14
(52) U.S. Cl. ...................................... 198/396; 198/407
(58) Field of Search ............................. 198/397.01, 443, 198/453, 444, 397.02–397.06, 407, 416, 384, 396, 446, 464.4, 465.2, 550.3

(56) References Cited

U.S. PATENT DOCUMENTS

| | | | | |
|---|---|---|---|---|
| 3,924,732 A | * | 12/1975 | Leonard ..................... | 198/287 |
| 4,078,650 A | * | 3/1978 | Dixon ........................ | 198/397 |
| 4,308,942 A | * | 1/1982 | Ackley ....................... | 198/380 |
| 4,741,428 A | * | 5/1988 | Taniguchi et al. .......... | 198/397 |
| 4,753,061 A | * | 6/1988 | Braden et al. ............... | 53/471 |
| 4,997,079 A | * | 3/1991 | Suopajarvi et al. ......... | 198/443 |
| 5,454,464 A | * | 10/1995 | Yamamoto et al. | |
| 5,636,725 A | | 6/1997 | Saito et al. | |
| 5,984,079 A | * | 11/1999 | Garcia .................... | 198/397.02 |
| 6,019,212 A | * | 2/2000 | Takahashi et al. .......... | 198/392 |
| 6,283,272 B1 | * | 9/2001 | Hsieh ........................ | 198/394 |

* cited by examiner

Primary Examiner—Christopher P. Schwartz
Assistant Examiner—Benjamin A. Pezzlo
(74) Attorney, Agent, or Firm—Oliff & Berridge, PLC

(57) ABSTRACT

An object supplying apparatus, including a housing, pulleys which are rotatable about respective substantially horizontal axis lines and at least one of which is provided in the housing, a conveyor belt which has a plurality of pockets provided in a surface thereof and arranged in a lengthwise direction thereof, and which is wound on the pulleys such that a portion of the belt extends in a substantially horizontal direction and the pockets provided in the portion of the belt open upward, a circulative lifter which is circulated on a substantially vertical plane in the housing, and which has at least one holder which holds at least one of a plurality of objects present in a lower portion of the housing, conveys the object upward, and releases the object at an object-release position in the housing, a guide device which is provided below the object-release position and which guides the object toward the portion of the conveyor belt, and a clearing device which clears, from the portion of the conveyor belt, the object which has not been accommodated in any of the pockets of the portion of the belt and is present on the portion of the belt.

29 Claims, 18 Drawing Sheets

OBJECT SUPPLYING APPARATUS

BACKGROUND OF THE INVENTION

1. Field of the Invention

The present invention relates to an apparatus for supplying objects such as leadless electric components and particularly to the art of improving the reliability with which the apparatus supplies the objects.

2. Related Art Statement

There is known an electric-component ("EC") supplying apparatus which supplies leadless ECs each of which has no leads or no lead wires and which are carried by an EC carrier tape. The EC carrier tape includes an EC accommodating tape having a plurality of pockets which are formed at a predetermined pitch and each of which accommodates an EC; and a cover tape which is adhered to the EC accommodating tape and covers respective openings of the pockets. The EC supplying apparatus includes a tape feeding device which feeds the EC carrier tape so that the ECs are fed one by one to an EC-supply portion of the apparatus from which each of the ECs is taken out by an EC holder.

Since the EC carrier tape holds the ECs in the pockets, the EC supplying apparatus can supply the ECs one by one, with high reliability. However, this apparatus suffers from various problems. For example, the apparatus needs to deal with a long EC accommodating tape having a number of EC accommodating pockets, to supply the ECs. In addition, the ECs must be accommodated in the pockets of the tape in advance.

Thus, there is a demand for an object supplying apparatus which can supply objects with high reliability, without using a carrier tape.

SUMMARY OF THE INVENTION

The present invention provides an object supplying apparatus which has one or more of the technical features that are described below in respective paragraphs given parenthesized sequential numbers (1) to (29). Any technical feature which includes another technical feature shall do so by referring, at the beginning, to the parenthesized sequential number given to the latter feature. Thus, two or more of the following technical features may be combined, if appropriate. Each technical feature may be accompanied by a supplemental explanation, as needed. However, the following technical features and the appropriate combinations thereof are just examples to which the present invention is by no means limited. In addition, in the case where one technical feature recites a plurality of items, it is not essentially required that all those items be simultaneously employed. That is, it is possible that only a portion (one, two, . . . , but not all) of those items be selected and employed.

(1) According to a first feature of the present invention, there is provided an object supplying apparatus, comprising a housing; a plurality of pulleys which are rotatable about respective substantially horizontal axis lines and at least one of which is provided in the housing; a conveyor belt which has a plurality of pockets provided in a surface thereof and arranged in a lengthwise direction thereof, and which is wound on the pulleys such that a portion of the belt extends in a substantially horizontal direction and the pockets provided in said portion of the belt open upward; a circulative lifter which is circulated on a substantially vertical plane in the housing, and which has at least one holder which holds at least one of a plurality of objects present in a lower portion of the housing, conveys the object upward, and releases the object at an object-release position in the housing; a guide device which is provided below the object-release position and which guides the object toward said portion of the conveyor belt; and a clearing device which clears, from said portion of the conveyor belt, the object which has not been accommodated in any of the pockets of said portion of the belt and is present on said portion of the belt. The holder may be provided by a bucket, a blade, or a permanent magnet. For example, in the case where a bucket is employed as the holder, the object held by the bucket hardly falls off the bucket as the circulative lifter is circulated, and accordingly the lifter can reliably convey the object. The object is guided by the guide device and is accommodated by the upward opening pocket of the conveyor belt. As the conveyor belt is moved, the object present in the pocket is conveyed to, e.g., an object-supply portion of the object supplying apparatus. One or more objects which are not accommodated in the pockets of the conveyor belt and are present on the belt are cleared from the belt by the clearing device. Some objects fall downward off the conveyor belt by being cleared by the clearing device, and other objects fall downward without being received on the belt when the objects are released from the holder of the circulative lifter. Those objects are conveyed upward by the holder of the circulative lifter, subsequently are released from the holder, and then are guided by the guide device toward the pockets of the conveyor belt. The clearing of objects by the clearing device, the conveying of objects by the circulative lifter, and the guiding of objects by the guide device are repeated, while each object is accommodated by one pocket at an appropriate convenience and is conveyed by the belt to the object-supply portion. The present object supplying apparatus can reliably supply, one by one, the objects each of which is accommodated in the pocket, without using a carrier tape. After one object is taken out from each pocket and the pocket is made empty, another object is accommodated by the pocket. Since in this way the conveyor belt can be used repeatedly, the present apparatus can supply the objects one by one with high reliability and at low cost. The present object supplying apparatus can be said as one which includes an object-carrier-tape producing device which produces an object carrier tape having a number of pockets formed in a lengthwise direction thereof and accommodating a number of objects, respectively; and a tape feeding device which intermittently feeds the object carrier tape through the object-supply portion. Thus, the present object supplying apparatus is equivalent to one which circulates the object carrier tape and repeatedly uses the same.

(2) According to a second feature of the present invention that includes the first feature (1), a first one of the plurality of pulleys is provided inside the housing and a second one of the pulleys is provided outside the housing, and said portion of the conveyor belt extends in the substantially horizontal direction between the first and second pulleys. According to the second feature (2), a pocket of a portion of the conveyor belt that is located in the vicinity of the second pulley opens upward, so that an object present in the upward opening pocket can be taken out by, e.g., a negative-pressure suction nozzle. In this case, it is preferred that a cover member be employed to cover a portion of the conveyor belt that is located between the housing and the suction nozzles so as to prevent one or more objects accommodated in one or more pockets of that portion of the belt, from jumping out of the pockets because of, e.g., vibration. However, it is possible to provide all of the plurality of pulleys and the entirety of the conveyor belt inside the housing. In the last case, the portion of the belt that extends in the substantially horizontal direction between the first and second pulleys, may be moved at a level below the top wall of the housing, with only a small space left between the portion of the belt and the top wall of the housing, and the top wall may have an aperture through which each object is taken out from each pocket of the belt, so that the top wall may function like the above-indicated cover member.

(3) According to a third feature of the present invention that includes the first or second feature (1) or (2), the circulative lifter comprises a rotatable lifter which is rotatable about a substantially horizontal axis line and which has a plurality of said holders in an outer peripheral portion thereof such that the holders are angularly spaced from each other about the horizontal axis line. The holders may be equiangularly spaced from each other about the horizontal axis line. The circulative lifter may otherwise be provided by a plurality of pulleys and a belt wound on the pulleys. However, the rotatable lifter rotatable about the horizontal axis line enjoys a simpler construction than the pulleys and the belt. The holders may be supported by an outer peripheral portion of one of opposite side surfaces of a disc-like member, or by an outer circumferential surface of a disc-like member. However, if the holders in accordance with the fourth feature (4) described below are employed, the objects can be easily conveyed upward and then released by utilizing the weights of the objects themselves.

(4) According to a fourth feature of the present invention that includes the third feature (3), the rotatable lifter comprises a rotatable drum including a circular portion and a cylindrical portion extending from an outer circumferential edge of the circular portion in a direction substantially perpendicular thereto, and the holders are supported by an inner circumferential surface of the cylindrical portion of the rotatable drum. One or more objects cleared from the conveyor belt by the clearing device are stored in the inner space of the rotatable drum, are conveyed upward by the holders as the drum is rotated, and are released at the object-release position above the guide device.

(5) According to a fifth feature of the present invention that includes the fourth feature (4), the plurality of holders comprises a plurality of blades which extend inward from the inner circumferential surface of the cylindrical portion of the rotatable drum. Each of the blades may be provided by a flat or plane member, or a bent or curved member. As the rotatable drum is rotated, each blade scoops one or more objects present in the drum, conveys the objects upward, and then releases the same. The angle of inclination of each blade relative to the inner circumferential surface of the cylindrical portion of the drum may be so determined that the each blade may release the objects at a desired position, or in a desired region, on the locus of revolution of the each blade about the axis line of rotation of the drum. Thus, each blade does not release the objects before it reaches the object-release position above the guide device, and it releases the objects after it reaches the object-release position.

(6) According to a sixth feature of the present invention that includes any one of the third to fifth features (3) to (5), the rotatable lifter is concentric with said one of the pulleys that is provided in the housing. According to the sixth feature (6), the rotatable lifter and the one pulley may be supported by a common axis member such that the two members are arranged in tandem in a direction parallel to the axis line about which the two members are rotatable. Thus, the present object supplying apparatus enjoys a compact construction, in particular, a small dimension in the direction parallel to the axis line of rotation of the two members. In addition, since the rotatable lifter and the one pulley can be provided adjacent to each other, it is easy to guide the objects conveyed by the rotatable lifter and released from the same, to the conveyor belt.

(7) According to a seventh feature of the present invention that includes any one of the first to sixth features (1) to (6), the clearing device comprises a clearing member which engages the object present on said portion of the conveyor belt and thereby clears the object from said portion of the belt. Otherwise, the clearing device may be one which blows air in a direction substantially parallel to the upper surface of the horizontal portion of the conveyor belt that extends in the horizontal direction, thereby blowing off one or more objects which are not accommodated in the pockets of the belt. In this case, however, the water vapor contained in the blown air may condense on each object and wet the same. This problem is not encountered by a mechanical clearing device including a clearing member. The clearing member may be a movable one in accordance with the eighth feature (8) described below, or a stationary one which is readable on the clearing member in accordance with the ninth feature (9). According to the seventh feature (7), the clearing member may be provided by an elastic member, or may be supported by an elastic member. In either case, even if an object may be jammed in a small space between the clearing member and the inner surface of one pocket of the belt, the clearing member and/or the object are prevented from being damaged.

(8) According to an eighth feature of the present invention that includes the seventh feature (7), the clearing device further comprises a clearing-related drive device which moves the clearing member to a clearing position thereof above said portion of the conveyor belt and to a retracted position thereof away from the clearing position. At the clearing position, the clearing member clears one or more objects from the conveyor belt and, at the retracted position, it allows one or more objects to be placed on the belt and accommodated in the pockets of the belt. According to the eighth feature (8), the clearing member may be (but may not be) positioned at the retracted position, when the objects conveyed by the circulative lifter are released, so that the clearing member does not interfere with one or more objects to be placed on the belt and accommodated in the pockets.

(9) According to a ninth feature of the present invention that includes the seventh feature (7), the guide device comprises a guide member having an inclined guide surface which is inclined such that a lower portion of the inclined guide surface is nearer to said portion of the conveyor belt than an upper portion of the inclined guide surface, and the guide member provides the clearing member. The inclined guide surface of the guide member that guides the objects to the conveyor belt may also function as a clearing surface which is located at a position higher than the belt and which clears one or more objects which are present on the belt and are not accommodated in the pockets of the belt. Alternatively, the guide member may have, in addition to the inclined guide surface, a clearing surface having the above-indicated function. According to the ninth feature (9), the guide member and the clearing member are provided by a single integral member. The clearing surface may be an inclined one which is inclined such that the surface extends in a direction from one of opposite side edges of the belt toward the other side edge, as it extends in the direction of movement of the portion of the belt that extends in the horizontal direction. According to the ninth feature (9), the object supplying apparatus enjoys a compact construction because the total number of the parts needed to construct the apparatus can be decreased.

(10) According to a tenth feature of the present invention that includes the ninth feature (9), the clearing device further comprises a clearing-related drive device which moves the guide member to a clearing position thereof above said portion of the conveyor belt and to a retracted position thereof away from the clearing position. According to the tenth feature (10) the guide member also functions as the clearing member. More specifically described, the guide member may function as the clearing member, when it is positioned at the clearing position, and may function as the guide member when it is positioned at the retracted position. The object supplying apparatus in accordance with the tenth feature (10) enjoys the same advantages as those of the apparatus in accordance with the eighth feature (8).

(11) According to an eleventh feature of the present invention that includes the eighth or tenth feature (8) or (10), the clearing-related drive device comprises a cam device including a cam which is attached to one of the rotatable lifter and the clearing or guide member and a cam follower which is attached to the other of the rotatable lifter and the clearing or guide member, and when the rotatable lifter is rotated, the cam and the cam follower engage each other and thereby moves the clearing or guide member to the clearing position thereof. It is preferred that the cam follower be provided by a rotatable member such as a ball or a roller. In this case, the cam follower engages the cam, with a small frictional force produced therebetween, and accordingly the durability of the cam and the cam follower is increased. As the rotatable lifter is rotated, the cam and the cam follower engage each other, so that the clearing member or the guide member is moved to the clearing position. With the cam and the cam follower, the rotatable lifter can be easily utilized to move the clearing member or the guide member to the clearing position.

(12) According to a twelfth feature of the present invention that includes the eleventh feature (11), the clearing-related drive device further comprises a biasing device which applies a biasing force to the clearing or guide member to move the clearing or guide member toward the retracted position thereof, and the cam device moves the clearing or guide member to the clearing position thereof against the biasing force of the biasing device. The biasing device may be provided by a spring or a rubber member each as a sort of elastic member. In this case, the biasing device can be produced at low cost.

(13) According to a thirteenth feature of the present invention that includes any one of the first to twelfth features (1) to (12), the housing comprises a case attaching device which can attach an object case in which a plurality of objects are stored, to the housing, such that the object case is detachable from the housing. When the objects present in the housing have been consumed out, the present object supplying apparatus may be replaced with another apparatus whose housing is filled with objects, so as to continue supplying the objects. However, this is cumbersome, and the supplying of objects is temporarily stopped. according to the thirteenth feature (13), the housing is supplied with the objects from the object case which is detachably attachable to the housing. In this case, the apparatus can continue supplying the objects, while the housing is supplied with new objects from a new object case which has replaced the empty object case.

(14) According to a fourteenth feature of the present invention that includes the thirteenth feature (13), the object supplying apparatus further comprises a constant-amount supplying device which is operable such that each time the supplying device is operated, the supplying device supplies a substantially constant amount of objects from the object case to the housing. The constant-amount supplying device can supply an appropriate amount of objects that are not too great or not too small, to the housing. If the amount of objects supplied to the housing is too great, the objects may apply too great a pressure to the circulative lifter. If the lifter is circulated in this state, the objects and/or lifter may be damaged. This problem is avoided by the present object supplying apparatus. If the amount of objects supplied to the housing is too small, some pockets of the conveyor belt may fail to accommodate objects, so that the supplying of objects may be interrupted. This problem is also avoided by the present apparatus.

(15) According to a fifteenth feature of the present invention that includes the thirteenth feature (13), the case attaching device is provided in a top portion of the housing, and the apparatus further comprises an object-amount control device which is provided below the case attaching device and which allows, each time the control device is operated, a substantially constant amount of objects to be supplied from the object case to the housing. The object supplying apparatus in accordance with the fifteenth feature (15) enjoys the same advantages as those of the apparatus in accordance with the fourteenth feature (14).

(16) According to a sixteenth feature of the present invention that includes the fifteenth feature (15), the object-amount control device comprises an upper shutter member which is provided in a communication passage connecting between an inner space of the object case and an inner space of the housing and which is movable to a shutting position thereof where the upper shutter member shuts the communication passage and to an opening position thereof where the upper shutter member opens the communication passage; a lower shutter member which is provided below the upper shutter member in the communication passage and which is movable to a shutting position thereof where the lower shutter member shuts the communication passage and to an opening position thereof where the lower shutter member opens the communication passage; and a shutter-member drive device which alternately moves each of the upper and lower shutter members to the shutting and opening positions thereof. When the upper shutter member is positioned at the opening position, the lower shutter member is positioned at the shutting position, so that some objects from the object case are kept in a space between the upper and lower shutter members. When, from this state, the upper shutter member is moved to the shutting position and the lower shutter member is moved to the opening position, the objects kept between the two shutter members fall into the housing. Since the upper shutter member being positioned at the shutting position shuts or closes the outlet of the object case, no other objects can move from the case to the housing. Thus, a substantially constant amount of objects that is defined by, e.g., the distance between the upper and lower shutter members are supplied to the housing. The upper and lower shutter members may be provided by two separate members which are driven by two exclusive drive devices, respectively. However, in the case where the upper and lower shutter members are provided by a single integral member which is driven by a single drive device, the present object supplying apparatus can enjoy a simple construction, can be produced at low cost, and can be easily controlled.

(17) According to a seventeenth feature of the present invention that includes the sixteenth feature (16), the object-amount control device comprises an escape member which is pivotable about a substantially horizontal axis line and which includes an upper end portion providing the upper shutter member and a lower end portion providing the lower shutter member, and the shutter-member drive device comprises an escape-member drive device which pivots the escape member about the horizontal axis line. As described above, the upper and lower shutter members may be provided by two separate members, respectively. However, the object supplying apparatus in accordance with the seventeenth feature (17) can be produced with a reduced number of parts. It is preferred that the escape member be provided in a recess which is formed in a side wall defining the communication passage and opens in the passage, so that the escape member defines a portion of the side wall.

(18) According to an eighteenth feature of the present invention that includes the sixteenth or seventeenth feature (16) or (17), the upper and lower shutter members are formed of an elastic material which is softer than the objects. The elastic material may be rubber or any analogous material, e.g., soft synthetic resin. The upper or lower shutter member may pinch an object with an opposite side wall defining the communication passage, when the shutter member is moved to the shutting position. However, according to the eighteenth feature (18), the shutter member is elastically deformed, so that the object is prevented from being damaged. In addition, when an object is pinched between the shutter member and the opposite side wall, only a very small space, or no space, is produced between the shutter member and the opposite side wall, so that no object can unexpectedly pass through the space.

(19) According to a nineteenth feature of the present invention that includes any one of the first to eighteenth features (1) to (18), the object supplying apparatus further comprises an object-amount-shortage detector which detects that an amount of the objects present in the housing is not greater than a predetermined amount. If the amount of objects present in the housing is too small, the circulative lifter may fail to convey objects upward, and accordingly the present object supplying apparatus may fail to supply objects. To avoid this problem, the apparatus in accordance with the nineteenth feature (19) includes the object-amount-shortage detector which detects that the amount of objects present in the housing is too small.

(20) According to a twentieth feature of the present invention that includes the nineteenth feature (19), the housing comprises a case attaching device which can attach an object case in which a plurality of objects are stored, to the housing, such that the object case is detachable from the housing, the apparatus further comprises an object-amount control device which is provided below the case attaching device and which allows, each time the control device is operated, a substantially constant amount of objects to be supplied from the object case to the housing, and the object-amount-shortage detector comprises an object-amount sensor which is provided at a reference position higher than a bottom surface of the housing and which produces a first signal when at least one object is present at the reference position and produces a second signal different from the first signal when no object is present at the reference position; and an object-amount-control-device control device which operates the object-amount-control device when the object-amount sensor continues producing the second signal for not less than a reference time. The object-amount sensor produces the first and second signals which cooperate with each other to be able to indicate that some amount of objects remains in the housing but the amount of objects remaining in the housing is not greater than a predetermined value, so that the object-amount-control device is operated to supply objects to the housing, before the amount of objects present in the housing becomes zero. Thus, the present apparatus can continue supplying objects, without needing to temporarily interrupt the supplying of objects, or without failing to supply one or more objects. In addition, since the object-amount-control device is operated when the object-amount sensor continues producing the second signal for not less than the reference time, the present apparatus is effectively prevented from operating the object-amount-control device when, in fact, the amount of objects present in the housing is not short. Accidentally, such a state may occur in which the amount of objects greatly decreases only in the vicinity of the object-amount sensor. However, this state does not last for more than the reference time. This case is not recognized as the shortage of the amount of objects. Thus, the present apparatus can reliably detect the shortage of the objects. In the case where the circulative lifter is provided by a rotatable lifter including a rotatable drum and the holders of the lifter are provided by blades which are provided inside the drum, it is preferred that the object-amount sensor be provided at the reference position higher than an upper end of one blade that is currently positioned at the lowest end of the locus of revolution of each blade. If the amount of objects remaining in the rotatable drum decreases to such an extent that the upper surface of the batch of objects is lower than the upper end of one blade currently positioned at the lowest end of the locus of revolution of each blade, one blade may scoop up all the remaining objects at once. Therefore, if the object-sensor is provided at a position lower than the upper end of one blade currently positioned at the lowest end of the locus of revolution of each blade, the object-amount sensor may be unable to detect any shortage of the objects before the amount of objects becomes zero. In many cases, however, the detection of the state in which the amount of objects is zero is too late.

(21) According to a twenty-first feature of the present invention that includes any one of the first to twentieth features (1) to (20), the pockets of the conveyor belt are formed at a predetermined pitch in the lengthwise direction of the belt, and the apparatus further comprises a belt drive device which rotates one of the pulleys at a predetermined angular pitch corresponding to the predetermined pitch at which the pockets are formed. The belt drive device and a lifter drive device for driving the circulative lifter may, or may not, share a common drive source. In the case where the belt drive device and the lifter drive device include respective independent drive sources, it is easy to cause the conveyor belt and the circulative lifter to perform their best motions.

(22) According to a twenty-second feature of the present invention that includes the twenty-first feature (21), the object supplying apparatus further comprises an object sensor which is provided at an object-detect position in a vicinity of said portion of the conveyor belt, and which produces a first signal when the object sensor detects an object present in the pocket being positioned at the object-detect position, and produces a second signal different from the first signal when the object sensor detects no object in the pocket being positioned at the object-detect position; and a belt-drive-device control device which stops the belt drive device when, after the object sensor has produced the first signal, the pocket accommodating the object detected by the object sensor has reached an object-supply portion of the apparatus from which the apparatus supplies the objects one by one, and which continues operating the belt drive device when, after the object sensor has produced the second signal, the pocket in which no object has been detected by the object sensor has reached the object-supply portion. The object-detect position may, or may not, belong to the object-supply portion. In the latter case, the object-detect position is located on an upstream side of the object-supply portion as seen in the direction of movement of the conveyor belt. In the former case, if no object is present in each pocket being positioned at the object-supply portion, the belt drive device is operated till a pocket accommodating an object reaches the object-supply portion. Thus, the present apparatus can prevent itself from failing to supply an object. In the latter case, the present apparatus supplies objects and concurrently detects whether each pocket accommodates an object and, when a pocket without an object, identified by the second signal, reaches the object-supply portion, the apparatus further operates the belt drive device. That is, till a pocket accommodating an object is positioned at the object-supply portion, the belt drive device is operated to move the conveyor belt by an amount corresponding to two or more pitches corresponding to two or more pockets. The belt-drive-device control device may be adapted to stop, when a pocket without an object reaches the object-supply portion, the belt drive device to stop the conveyor belt for a time shorter than a time for which a pocket with an object is stopped at the object-supply portion, and then resume the belt drive device to move the belt, or may be adapted to continuously operate the belt drive device to continuously move the belt, when a pocket without an object reaches the object-supply portion. In the latter case in which the object-detect position does not belong to the object-supply portion, the belt-drive-device control device can recognize a pocket without an object before the pocket reaches the object-supply portion and accordingly can easily control the belt drive device and accordingly the conveyor belt.

(23) According to a twenty-third feature of the present invention that includes any one of the first to twenty-second features (1) to (22), each of the objects is a leadless electric component having no lead. The leadless electric component has, for example, a generally rectangular-parallelopiped shape.

(24) According to a twenty-fourth feature of the present invention, there is provided an object supplying apparatus, comprising a housing which has, in a top portion thereof, a case attaching device which can attach an object case in which a plurality of objects are stored, to the top portion thereof, such that the object case is detachable from the housing; an object-amount control device which is provided below the case attaching device and which allows, each time the control device is operated, a substantially constant amount of objects to be supplied from the object case to the housing; a plurality of pulleys which are rotatable about respective substantially horizontal axis lines and at least one of which is provided in the housing; a conveyor belt which has a plurality of pockets provided in a surface thereof and arranged in a lengthwise direction thereof, and which is wound on the pulleys such that a portion of the belt extends in a substantially horizontal direction and the pockets provided in said portion of the belt open upward; a guide device which guides at least one of the objects toward said portion of the conveyor belt; and a clearing device which clears, from said portion of the conveyor belt, the object which has not been accommodated in any of the pockets of said portion of the belt and is present on said portion of the belt. The objects stored in the object case are guided by the guide device onto the conveyor belt, so as to be accommodated in the pockets of the belt. One or more objects which are present on the conveyor belt and are not accommodated in the pockets are cleared by the clearing device, are again placed on the belt so as to be accommodated in the pockets. It is preferred that the clearing device be one which clears one or more objects in a direction toward an upstream side thereof as seen in the direction of movement of the belt, because the chances that the objects cleared are accommodated in the pockets are increased, the objects cleared do not gather at a portion of the belt that is located in the vicinity of the object-supply portion, or do not interfere with the objects to be supplied, and the objects cleared do not gather at the vicinity of an outlet of the housing through which the belt is moved out, or do not interfere with the belt to be moved out. The object supplying apparatus in accordance with the twenty-fourth feature (24) may employ any one of the second, seventh to tenth, and sixteenth to twenty-third features (2), (7) to (10), and (16) to (23).

(25) According to a twenty-fifth feature of the present invention, there is provided an object supplying apparatus, comprising a housing; an object supplier which is provided above the housing, which stores a plurality of objects, and which supplies the objects to the housing; an object-amount control device which is provided between the housing and the object supplier and which allows, each time the control device is operated, a substantially constant amount of objects to be supplied from the object supplier to the housing; a plurality of pulleys which are rotatable about respective substantially horizontal axis lines and at least one of which is provided in the housing; a conveyor belt which has a plurality of pockets provided in a surface thereof and arranged in a lengthwise direction thereof, and which is wound on the pulleys such that a portion of the belt extends in a substantially horizontal direction and the pockets provided in said portion of the belt open upward; a guide device which guides at least one of the objects toward said portion of the conveyor belt; and a clearing device which clears, from said portion of the conveyor belt, the object which has not been accommodated in any of the pockets of said portion of the belt and is present on said portion of the belt. The object case employed in the object supplying apparatus in accordance with the twenty-fourth feature (24) is an example of the object supplier employed in the object supplying apparatus in accordance with the twenty-fifth feature (25). However, the object supplier is not limited to the object case. For example, the object supplier may comprise a hopper which is attached to the housing, has an opening in an upper end thereof, stores objects cast through the opening, and supplies the objects to the housing. It is preferred that the opening of the hopper be covered with a cover member which can be opened and closed. The object supplying apparatus in accordance with the twenty-fifth feature (25) may employ any one of the second, seventh to tenth, and sixteenth to twenty-third features (2), (7) to (10), and (16) to (23).

(26) According to a twenty-sixth feature of the present invention, there is provided an object supplying apparatus, comprising a housing; an object supplier which is provided above the housing, which stores a plurality of objects, and which supplies the objects to the housing; an object-amount control device which is provided between the housing and the object supplier and which allows, each time the control device is operated, a substantially constant amount of objects to be supplied from the object supplier to the housing; a plurality of pulleys which are rotatable about respective substantially horizontal axis lines and at least one of which is provided in the housing; a conveyor belt which is wound on the pulleys such that a portion of the belt extends in a substantially horizontal direction; a guide device which guides the objects toward said portion of the conveyor belt; and a clearing device which clears, from said portion of that conveyor belt, the object which has been inappropriately placed on said portion of the belt. The conveyor belt may not have any pockets for accommodating objects. The conveyor belt may one which has a continuous groove extending in a lengthwise direction thereof, according to the twenty-seventh feature (27), or a flat one. The object supplying apparatus in accordance with the twenty-sixth feature (26) may employ any one of the second, seventh to tenth, and sixteenth to twenty-third features (2), (7) to (10), and (16) to (23).

(27) According to a twenty-seventh feature of the present invention that includes the twenty-sixth feature (26), the conveyor belt has a groove extending in a lengthwise direction thereof in an outer surface thereof, and the guide device guides the objects toward the groove of the portion of the conveyor belt.

(28) According to a twenty-eighth feature of the present invention that includes the twenty-sixth feature (26), the guide device guides the objects toward an upper surface of the portion of the conveyor belt.

(29) According to a twenty-ninth feature of the present invention that includes any one of the twenty-sixth to twenty-eighth features (26) to (28), the clearing device comprises an air-blow device which blows air toward the inappropriately placed object, thereby clearing the object from the portion of the conveyor belt.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, preferred embodiments of the present invention will be described in detail by reference to the drawings.

Figure 1:
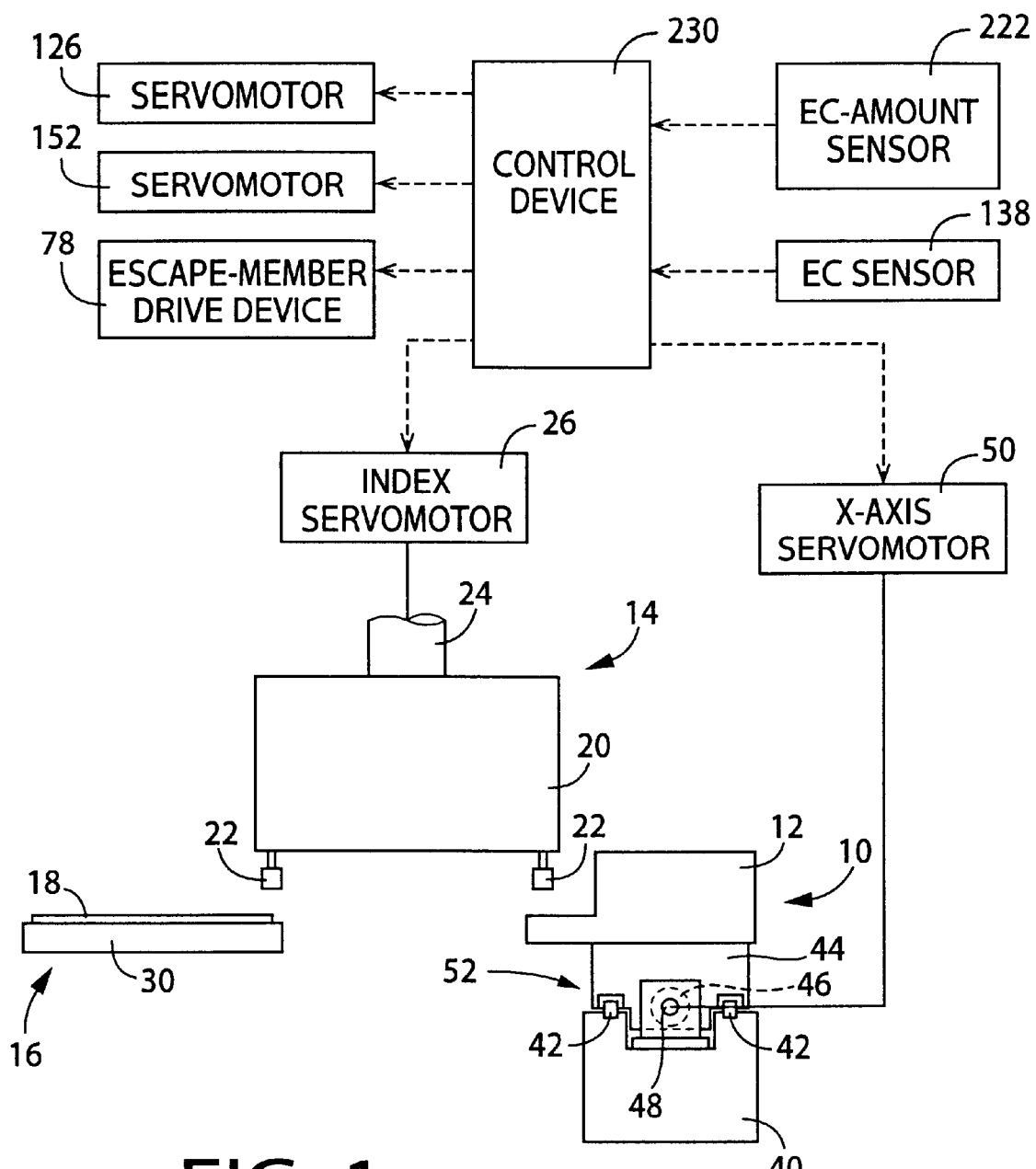
FIG. 1 is a schematic front elevation view of an an electric-component ("EC") mounting machine including an EC supplying system including an EC feeder to which the present invention is applied.

In FIG. 1, reference numeral 10 designates an electric-component ("EC") supplying system to which the present invention is applied. The EC supplying system 10 includes a plurality of EC feeders 12 each as an object supplying device (only one EC feeder 12 is shown in FIG. 1). Each of the EC feeders 12 supplies electric components ("ECs") to an EC mounting system 14 as a sort of EC taking-out system. The EC mounting system 14 mounts the ECs on a printed-wiring board ("PWB") 18 which is positioned and supported by a PWB positioning and supporting system 16.

The EC supplying system 10, the EC mounting system 14, and the PWB positioning and supporting system 16 cooperate with one another to provide an EC mounting machine.

The EC mounting system 14 includes an index table 20 which is intermittently rotatable about a vertical axis line. The index table 20 has a plurality of (e.g., twelve) EC-suck heads 22 each as an EC holder (only two EC-suck heads 22 are shown in FIG. 1), and is intermittently rotated by an intermittently rotating device which is provided by a cam and a cam follower (both not shown), a rotary shaft 24, an index servomotor 26 which rotates the cam, etc., so that the twelve EC-suck heads 22 are sequentially moved to, and stopped at, an EC-suck position, an EC-posture-detect position, an EC-posture-correct position, an EC-mount position, etc. The EC-suck heads 22 are supported by the index table 20, such that each of the heads 22 can be vertically elevated and lowered, and two elevating and lowering devices (not shown) each of which elevates and lowers each EC-suck head 22 are provided at the EC-suck position and the EC-mount position, respectively. The rotation of the index servomotor 26 is converted by a motion converting device which is provided by a cam and a cam follower (not shown), etc., into upward and downward movement of an elevator member (not shown), which causes each EC-suck head 22 to be elevated and lowered.

The PWB positioning and supporting system 16 includes a PWB-support table 30 which positions and supports the PWB 18. The PWB-support table 30 is provided on an X-Y table (not shown) which is movable in an X-axis direction (i.e., a direction perpendicular to the sheet of FIG. 1) and a Y-axis direction (a widthwise direction of the sheet of FIG. 1) which are perpendicular to each other on a horizontal plane. Thus, owing to the movement of the X-Y table, the PWB 18 is movable to an arbitrary position on the horizontal plane. The PWB 18 is conveyed, and carried in onto the PWB-support table 30, by a carry-in conveyor (not shown), and is carried out off the PWB-support table 30, and conveyed, by a carry-out conveyor (not shown), all in a direction parallel to the X-axis direction. When ECs are mounted on the PWB 18, the PWB 18 is moved by the X-Y table, so that each of prescribed EC-mount locations on the PWB 18 is positioned right below the EC-suck head 22 being positioned at the EC-mount position and the EC held by the EC-suck head 22 is mounted at the each EC-mount location on the PWB 18.

Next, the EC supplying system 10 will be described.

The EC supplying system 10 includes a base 40 on which a pair of guide rails 42 each as a guide member are provided to extend parallel to the X-axis direction and provide a guide device. An X-axis table 44 as a sort of movable table fits on the guide rails 42, such that the X-axis table 44 is movable in the X-axis direction. On the X-axis table 44, the above-indicated plurality of EC feeders 12 are provided such that respective EC-supply portions of the EC feeders 12 are arranged along a reference line (in the present embodiment, a straight line parallel to the X-axis direction) and each of the EC feeders 12 feeds ECs in an EC-feed direction thereof parallel to the Y-axis direction. The EC-supply portion of each EC feeder 12 is a portion thereof from which ECs are supplied to the EC mounting system 14, and can also be said as an EC-take-out portion thereof from which the ECs are taken out by the EC mounting system 14.

A nut 46 is fixed to the X-axis table 44, and is threadedly engaged with a feed screw 48 which is provided on the base 40 such that the feed screw 48 is not movable relative to the base 40 in an axial direction of the screw 48 and is rotatable relative to the base 40 about an axis line of the screw 48 parallel to the X-axis direction. When the feed screw 48 is rotated about its axis line by an X-axis servomotor 50, the X-axis table 44 is moved in the X-axis direction, so that the respective EC-supply portions of the EC feeders 12 are selectively positioned at a position right below the EC-suck head 22 being positioned at the EC-suck position. The nut 46, the feed screw 48, and the X-axis servomotor 50 cooperate with one another to provide a table moving device 52.

Next, each EC feeder 12 will be described.

Figure 2:
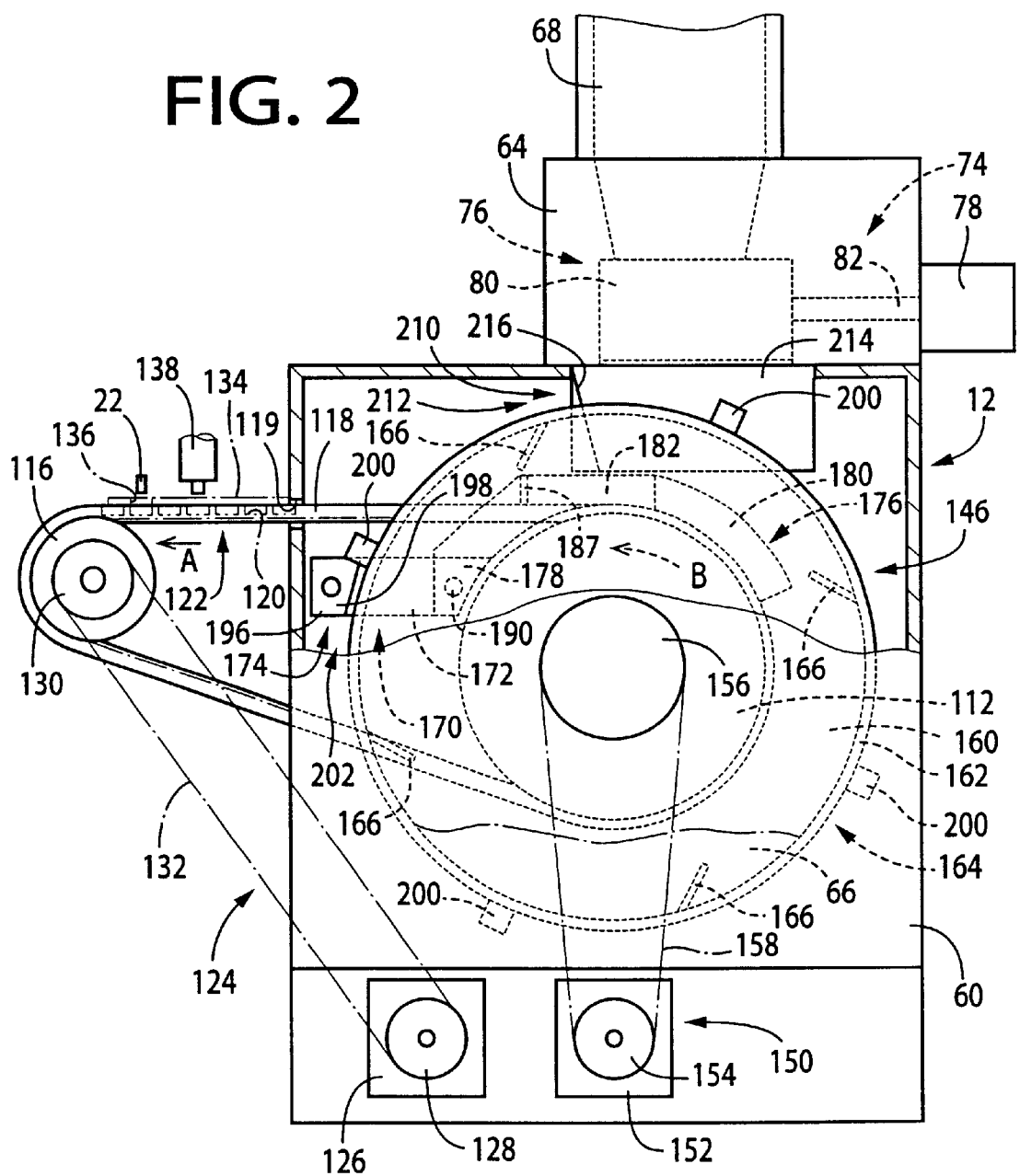
FIG. 2 is a partly cut away, front elevation view of the EC feeder.

As shown in FIG. 2, the EC feeder 12 includes a housing 60, which is positioned by a positioning device (not shown) relative to the X-axis table 44 such that a widthwise direction and a lengthwise direction of the housing 60 are parallel to the X-axis and Y-axis directions, respectively, and which is attached by an attaching device (not shown) to the X-axis table 44 such that the housing 60 cannot be moved up off the table 44. The lengthwise direction of the housing 60 is parallel to the EC-feed direction and is perpendicular to the widthwise direction. The EC feeder 12 can be detached from the X-axis table 44 by releasing the housing 60 from the attaching device.

Figure 3:
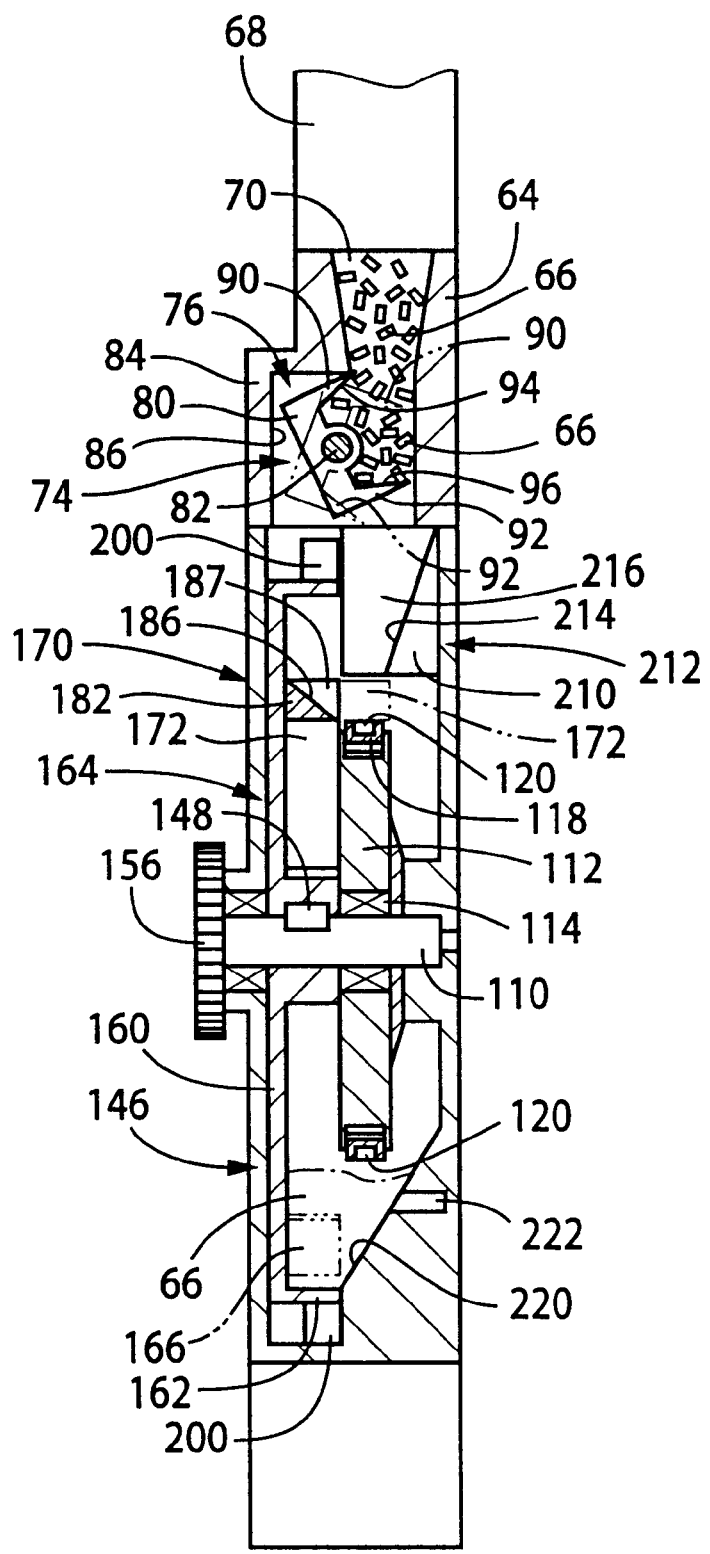
FIG. 3 is a partly cross-sectioned, side elevation view of the EC feeder.

A case attaching device 64 is provided on a top portion of the housing 60, and attaches an EC case 68 in which a number of ECs 66 (FIG. 3) as objects are stored, to the top portion of the housing 66, such that the EC case 68 is detachable from the housing 60. Each of the ECs 66 is a so-called 'leadless' EC having no lead wire. As shown in FIG. 3, the case attaching device 64 has an inner communication passage 70 which communicates between respective inner spaces of the EC case 68 and the housing 60. The case attaching device 64 is known in the art, and no further detailed description or illustration is provided.

An EC-amount regulating or control device 74 is provided below the case attaching device 64, and includes an escape member 76 and an escape-member drive device 78. The escape member 76 includes a pivotable plate 80 as a pivotable member. As shown in FIG. 2, the pivotable plate 80 has an elongate shape and, as shown in FIG. 3, the plate 80 is provided in the communication passage 70 such that the plate 80 is pivotable with a horizontal axis member 82 which extends parallel to the EC-feed direction of the EC feeder 12. The axis member 82 is provided at a position offset toward one 84 of two side walls of the case attaching device 64 that are opposed to each other in the widthwise direction of the EC feeder 12. The escape member 76 is provided in a recess 86 which is formed in the side wall 84 and opens in the communication passage 70, and provides a portion of the side wall 84.

A widthwise direction of the pivotable plate 80 is perpendicular to the horizontal axis member 82. The pivotable plate 80 includes a rectangular flat portion, and an upper shut projection 90 and a lower shut projection 92 which perpendicularly project from an upper end portion and a lower end portion of the flat portion, respectively, each into the communication passage 70. The upper shut projection 90 and the lower shut projection 92 provide an upper shut member and a lower shut member, respectively. Each of the upper shut projection 90 and the lower shut projection 92 extends in a lengthwise direction of the pivotable plate 80, so that the escape member 76 has a generally U-shaped cross section taken along a plane perpendicular to the lengthwise direction. In the present embodiment, the upper shut member and the lower shut member are provided by the integral member 80, such that the upper shut member is provided above the lower shut member in the communication passage 70. The upper shut projection 90 and the lower shut projection 92 have respective inclined surfaces 94, 96 which are opposed to each other and are inclined such that the distance between the two surfaces 94, 96 increases in a direction away from the flat portion of the pivotable plate 80. In addition, the escape member 76 is formed of a rubber as an elastic material that is softer than the ECs 66.

In the present embodiment, the escape-member drive device 78 is provided by a rotary solenoid which can pivot the horizontal axis member 82 within a predetermined angular range. Thus, the escape member 76 is pivoted about a horizontal axis line of the axis member 82, so that the upper and lower shut projections 90, 92 positioned above and below the axis member 82 are alternately moved to their shutting positions where the two shut projections 90, 92 shut the communication passage 70, and are alternately moved to their opening positions where the two shut projections 90, 92 open the communication passage 70. When the upper shut projection 90 is positioned at its opening position, as indicated at solid line in FIG. 3, the lower shut projection 92 is positioned at its shutting position, so that a predetermined amount of ECs 66 stored in the EC case 68 fall passing by the upper shut projection 90 and are received by the lower shut projection 92. Thus, the ECs 66 cannot enter the housing 60, and are reserved in a space between the two projections 90, 92. The position of the escape member 76, indicated at solid line in FIG. 3, will be referred to as an EC-receive position. When the escape member 76 is pivoted to a position, indicated at two-dot chain line in FIG. 3, where the upper projection 90 is positioned at its shutting position and the lower projection 92 is positioned at its opening position, the ECs 66 reserved by the escape member 76 fall into the inner space of the housing 60. The position of the escape member 76, indicated at two-dot chain line in FIG. 3, will be referred to as an EC-supply position. Since the communication passage 70 is shut or closed by the upper projection 90, no ECs 66 cannot directly move from the EC case 68 into the housing 60. That is, the substantially constant amount of ECs 66 that are reserved in the escape member 76 and are defined by the distance between the upper and lower projections 90, 92 and the length of the pivotable plate 80, are supplied to the housing 60.

Figure 4:
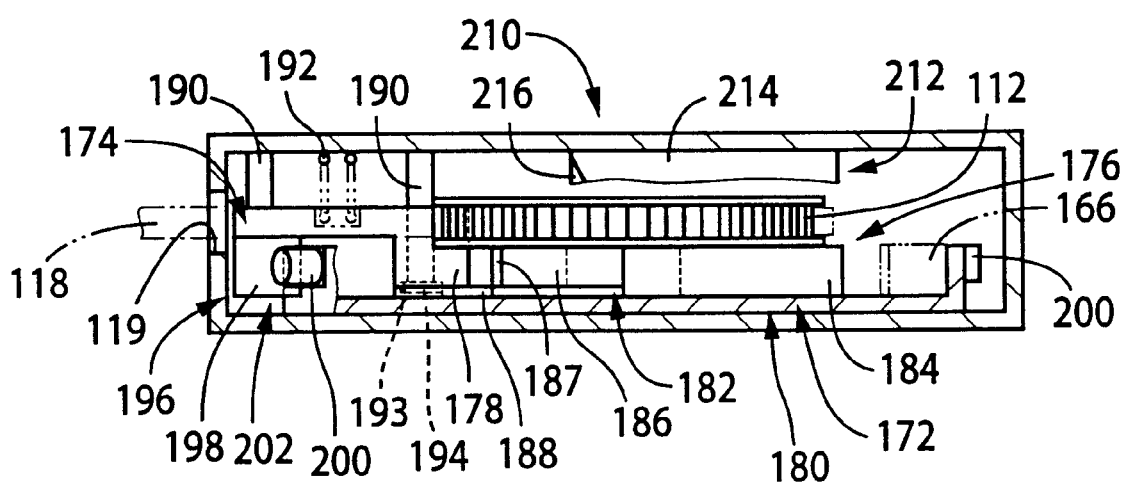
FIG. 4 is a plan view of a rotatable lifter, a pulley, and a guide member of the EC feeder.

As shown in FIG. 3, in the housing 60, there is provided an axis member 110 which is rotatable about a horizontal axis line parallel to the X-axis direction, and which supports, via a bearing 114, a timing pulley 112 as a sort of pulley such that the timing pulley.112 is rotatable relative to the axis member 110 and is not movable relative thereto in an axial direction thereof. In addition, as shown in FIG. 2, outside the housing 60, there is provided another timing pulley 116 as a sort of pulley that is supported by a support portion (not shown) of the housing 60 such that the timing pulley 116 is rotatable about a horizontal axis line parallel to the axis line about which the pulley 112 is rotatable. A conveyor belt 118 is wound on the two timing pulleys 112, 116. As shown in FIGS. 2 and 4, the conveyor belt 118 extends from the pulley 112 inside the housing 60, to the pulley 116 outside the housing 60, via an opening 119 formed through a side wall of the housing 60.

Figure 5:
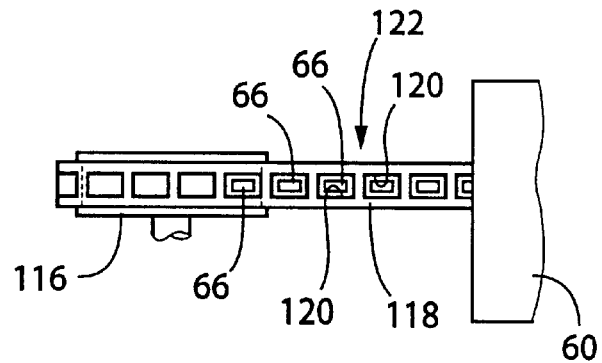
FIG. 5 is a plan view of a housing and a conveyor belt of the EC feeder.
Figure 6:
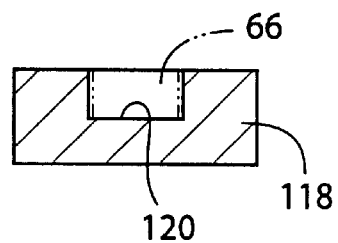
FIG. 6 is a cross-sectioned side elevation view of an EC pocket of the conveyor belt.

In the present embodiment, the conveyor belt 118 is formed of a steel as a sort of metal, has an endless annular shape, and is positioned on a vertical plane. As shown in FIGS. 2 and 5, the conveyor belt 118 has a plurality of pockets 120 which open in an outer surface of the belt 118 and which are formed at a regular interval of distance, i.e., at a predetermined pitch in a lengthwise direction of the belt 118. The conveyor belt 118 is provided by a timing belt that has, on its inner surface, teeth which are meshed with teeth of the timing pulleys 112, 116. The conveyor belt 118 includes two straight portions which extend between the pulley 112 inside the housing 60 and the pulley 116 outside the housing 60, and an upper one 122 of the two straight portions is horizontal between the two pulleys 112, 116. The horizontal portion 122 has a plurality of pockets 120 which open upward in an upper surface of the portion 122 and are arranged in an array in a lengthwise direction of the portion 122, and each of which can accommodate one EC 66. In the present embodiment, as shown in FIG. 6, each pocket 120 has a depth equal to a height of each EC 66, and accordingly the upper surface of the EC 66 accommodated in the pocket 120 is flush with the upper surface of the horizontal portion 122 of the conveyor belt 118.

As shown in FIG. 2, the outside pulley 116 is rotated by a belt drive device 124 which includes a servomotor 126 as its drive source. The rotation of the servomotor 126 is transmitted to the outside pulley 116, via two timing pulleys 128, 130 and a timing belt 132, so that the outside pulley 116 is rotated and the conveyor belt 118 is circulated. Since, as described above, the conveyor belt 118 is a timing belt and the pulleys 112, 116 are timing pulleys, the belt 118 can be accurately moved or circulated by an arbitrary distance or amount by controlling the servomotor 126.

A portion of the horizontal portion 122 of the conveyor belt 118 that is near to the outside pulley 116 is located outside the housing 60, and accordingly the pockets 120 of that portion of the horizontal portion 122 are accessible by each of the EC-suck heads 22 of the EC mounting system 14. More specifically described, the EC-suck head 22 (e.g., a suction nozzle) being positioned at the EC-suck position takes out the EC 66 from the pocket 120 being positioned right below the head 22. An EC-supply portion of the EC feeder 12 includes the EC-supply position where the EC-suck head 22 takes out the EC 66 from the pocket 120 of the horizontal portion 122 of the conveyor belt 118. As shown in FIG. 2, the housing 60 is provided with a cover member 134 which covers the portion of the horizontal portion 122 of the conveyor belt 118 that is near to the outside pulley 116 and is located outside the housing 60, and which prevents the ECs 66 from jumping out of the pockets 120. In the present embodiment, the cover member 134 is formed of a colorless, transparent synthetic resin and has, at a position corresponding to the EC-supply position, an aperture 136 which allows the EC-suck head 22 to take out the EC 66 from the pocket 120 being positioned at the EC-supply position.

As shown in FIG. 2, an EC sensor 138 as an object sensor is provided, outside the housing 60, at an EC-detect position on an upstream side of the EC-supply position as viewed in the EC-feed direction, indicated at arrow "A". The EC sensor 138 can detect an EC 66 as distinguished from the steel-based conveyor belt 118 and the colorless transparent cover member 134. The EC sensor 138 is provided by a reflection-type photoelectric switch as a sort of photoelectric sensor that includes a light emitter and a light receiver and produces different signals depending upon whether or not an amount of a light emitted by the light emitter and received by the light receiver is greater than a threshold value. According, so long as each EC 66 has a reflection coefficient detectably different from those of the conveyor belt 118 and the cover member 134, the EC sensor 138 can detect or identify the EC 66 from the belt 118 and the cover 134. For example, each EC 66 may have such a color, or may be formed of such a material, which is detectably different from those of the belt 118 and the cover 134. In the present embodiment, the cover member 134 is a colorless transparent member which transmits the light emitted by the light emitter of the EC sensor 138, and the conveyor belt 118 has such a color which assures that the amount of light reflected by the bottom surface of each pocket 120 is significantly different from the amount of light reflected by each EC 66. For example, in the case where each EC 66 has a black color, the conveyor belt 118 has a white color.

The EC sensor 138 is provided at a position slightly higher than the cover member 134, such that the sensor 138 is oriented downward. Thus, the EC sensor 138 is provided in the vicinity of the horizontal portion 122 of the conveyor belt 118, and produces different signals depending upon whether or not an EC 66 is present in the pocket 120 being positioned at the EC-detect position. Since the EC sensor 138 is provided by the reflection-type photoelectric switch, the sensor 138 can detect each EC 66 even when the EC 66 is being moved.

However, the EC sensor 138 may be provided by a transmission-type photoelectric switch as a sort of photoelectric sensor, or by a proximity switch such as of capacitance type or high-frequency type. In the former case, the cover member 134 and the conveyor belt 118 are transparent ones and each EC 66 is an opaque one. In the latter case, the cover member 134 and the conveyor belt 118 are formed of a non-metallic material such as a synthetic resin, and each EC 66 includes a metallic portion (e.g., an electrode) which can be detected by the proximity switch as the EC sensor 138.

As shown in FIG. 3, in the housing 60, a rotatable lifter 146 as a circulative lifter is attached to the axis member 110 such that the rotatable lifter 146 is inhibited by an inhibiting device including a key 148 from being rotated relative to the axis member 110 and being moved relative thereto in an axial direction thereof. Thus, in the housing 60, the rotatable lifter 146 and the inside pulley 112 are rotatable about the common horizontal axis line and are arranged in tandem along the axis line, and the lifter 146 is rotatable on a vertical plane. The rotatable lifter 146 is rotated by a lifter drive device 150 which includes a servomotor 152 as its drive source. The rotation of the servomotor 152 is transmitted to the axis member 110 via two timing pulleys 154, 156 and a timing belt 158, so that the lifter 146 is rotated at an arbitrary speed in an arbitrary direction. In the present embodiment, the lifter 146 is rotated in the same direction as that in which the inside pulley 112 is rotated. However, the lifter 146 may be rotated in a direction opposite to the direction of rotation of the inside pulley 112.

As shown in FIGS. 2 and 3, the rotatable lifter 146 includes a rotatable drum 164 including a circular bottom portion 160 and a cylindrical side portion 162 perpendicularly extending from an outer circumferential edge of the circular bottom portion 160. The lifter 146 additionally includes a plurality of (e.g., four) blades 166 each as an EC holder that are equiangularly spaced from one another about the axis member 110 and are supported by an outer peripheral portion of the lifter 146, i.e., an inner circumferential surface of the cylindrical portion 162.

In the present embodiment, each of the blades 166 is provided by a flat plate, and extends obliquely inward from an inner circumferential surface of the cylindrical portion 162, such that when each blade 166 is positioned at an angular position corresponding to 1 o'clock and 30 minutes as viewed in FIG. 2, the each blade 166 takes a horizontal position. Each blade 166 is revolved about the axis member 110 in a direction indicated at arrow "B". Thus, the above-indicated angular position is 45 degrees upstream of the highest position on the locus of revolution of each blade 166 about the axis member 110, as viewed in the direction of revolution of each blade 166. Each blade 166 extends from the inner surface of the cylindrical portion 162, in an obliquely inward direction from the upstream side toward the downstream side as viewed in the direction "B".

Each blade 166 and the inner surface of the cylindrical portion 162 cooperate with each other to contain an acute angle. Accordingly, at the lowest position on the locus of revolution of each blade 166 about the axis member 110, each blade 166 extends upward and can scoop the ECs 66 present in a lower portion of an inner space of the cylindrical portion 162 of the lifter 146. As the lifter 146 is rotated, each blade 166 is moved upward, then takes its horizontal position at the above-indicated angular position, and is further moved upward to have a downward component. Thus, each blade 166 does not release the ECs 66 before it reaches a position right above a movable clearing member 172 described later, and, when it reaches that position, it releases the ECs 66 so that the ECs 66 fall down onto the clearing member 172. Hereinafter, a region in which each blade 166 releases the ECs 66 will be referred to as an EC-release region as an object-release region. As shown in FIG. 3, each blade 166 has a width equal to an amount or distance of projection of the cylindrical portion 162 from the circular portion 160. Thus, one of axially opposite open ends of the cylindrical side portion 162 is closed by the circular bottom portion 160, and accordingly the ECs 66 scooped by each blade 166 are effectively prevented from falling off before reaching the EC-release region.

In the housing 60, there is provided a clearing device 170 which clears one or more ECs 66 which have not been accommodated in any of the pockets 120 of the conveyor belt 118 and are present on the belt 118. The clearing device 170 includes the movable clearing member 172 which is movable in opposite directions parallel to the axis member 110 of the rotatable lifter 146, and a clearing-related drive device 174 which moves the clearing member 174. As shown in FIGS. 2 and 4, the clearing member 172 includes a clearing portion 176 and a support portion 178. The clearing portion 176 is located at a position slight higher than a portion of the conveyor belt 118 that is wound on the inside pulley 112, and includes a part-annular clearing portion 180 and a linear clearing portion 182. The part-annular clearing portion 180 extends along the outer circumference of the inside pulley 112, and the linear clearing portion 182 extends from the part-annular portion 180 along the horizontal portion 122 of the belt 118, and is located at a position slightly higher than the horizontal portion 122. The part-annular portion 180 has a triangular cross section, and has an upper surface 184 which is defined by a portion of a conical surface whose centerline coincides with the horizontal axis line about which the pulley 112 is rotated. Thus, the upper surface 184 is inclined such that the surface 184 extends downward as it approaches the belt 118. As shown in FIG. 3, the linear portion 182 has an upper plane surface 186 which is inclined such that the surface 186 extends downward as it approaches the belt 118. A rectangular vertical wall 187 extends upward from one of opposite ends of the linear portion 182 that is distant from the part-annular portion 180, and prevents the ECs 66 from falling from each of the blades 166 of the lifter 146, to one of both sides of the upper surface 186 that is distant from the upper surface 184, and from falling from the conveyor belt 118 to a downstream side of the pulley 112 as seen in the direction of the horizontal portion 122 of the belt 118.

As shown in FIG. 4, the clearing portion 176 and the support portion 178 are connected to each other by a thin connection plate 188 which is provided on one of both sides of the linear clearing portion 182 that is distant from the conveyor belt 118. The support portion 178 is provided below the horizontal portion 122 of the belt 118, and projects from the connection plate 188 in a direction parallel to the axis line of rotation of the inside pulley 112 and away from the rotatable lifter 146.

The support portion 178 fits on two guide rods 190 which are supported by the housing 60 such that the guide rods 190 extend parallel to the axis line of rotation of the inside pulley 112. The movable clearing member 172 is biased toward its retracted position by a compression coil spring 192 as an elastic member as a sort of biasing device that is provided between the clearing member 172 and a side wall of the housing 60. As shown in FIG. 4, the limit of movement of the clearing member 172 by the biasing action of the coil spring 192 is defined by engagement of a shoulder or stopper surface 193 of the clearing member 172 with a large-diameter head or engageable portion 194 of one of the two guide rods 190. This limit of movement of the clearing member 172 corresponds to the retracted position of the clearing 172 where the clearing portion 176 is offset from the conveyor belt 118 and is accommodated in the cylindrical portion 162 of the lifter 146. The two guide rods 190 cooperate with each other to provide a guide device which guides the movement of the movable clearing member 172, and the one guide rod 190 having the head portion 194 provides a stopper.

Figure 7:
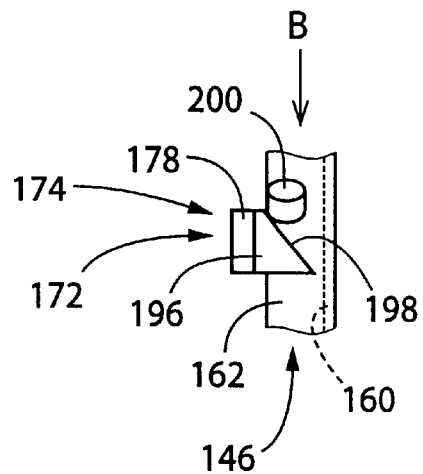
FIG. 7 is a side elevation view of a cam of a cam device as a clearing-related drive device of the EC feeder.

Even in the state in which the movable clearing member 172 is positioned at its retracted position, a portion of the support portion 178 is positioned outside the cylindrical portion 162 of the rotatable lifter 146. To that portion of the support portion 178, a can 196 is attached. As shown in FIGS. 2 and 4, the cam 196 is provided outside the cylindrical portion 162 of the lifter 146 and, as shown in FIG. 7, the cam 196 has a cam surface 198 which is inclined such that the surface 198 extends in a direction away from the inside pulley 112 as it extends in the direction "B" in which the lifter 146 is rotated.

A plurality of (e.g., four) rollers 200 each as a cam follower are provided on an outer circumferential surface of the cylindrical portion 162 of the rotatable lifter 146, such that the four rollers 200 are equiangularly spaced from each other about the axis line of rotation of the lifter 146 and each roller 200 is rotatable about an axis line perpendicular to the axis line of rotation of the lifter 146. The rollers 200 cooperate with the cam 196 to provide a cam device 202. When the lifter 146 is rotated, the four rollers 200 sequentially engage the cam surface 198 of the cam 196. While none of the rollers 200 engages the cam surface 198, the movable clearing member 172 is positioned at its retracted position by the biasing action of the coil spring 192 and the cam surface 198 is positioned on the locus of revolution of the rollers 200. When one of the rollers 200 engages the cam surface 198 as the lifter 146 is rotated, the movable clearing member 172 is moved, owing to the effect of inclination of the cam surface 198, to its clearing position, indicated in two-dot chain line in FIG. 3, against the biasing action of the spring 192. At the clearing position, the clearing member 172 is positioned above the conveyor belt 118 to clear, from the belt 118, one or more ECs 66 each of which has not been accommodated in any of the pockets 120 of the belt 118 and is present on the belt 118. Thus, the EC or ECs 66 falls or fall from the belt 118. Since the connection plate 188 of the clearing member 172 is thin, the plate 188 does not interfere with the belt 118 when the clearing member 172 is positioned at its clearing position. When the one roller 200 is disengaged from the cam surface 198 as the lifter 146 is further rotated, the clearing member 172 is moved to its retracted position by the biasing action of the coil spring 192.

In the present embodiment, the same number (e.g., four) of rollers 200 as the number of the blades 166 are equiangularly spaced from one another. More specifically described, the rollers 200 are provided at such respective angular phases relative to the corresponding blades 166 that assure that when the clearing member 172 is moved to its clearing position to clear one or more ECs 66 from the belt 118, none of the blades 166 has not reached the EC-release region and, after the clearing member 172 is moved to its retracted position, one of the blades 166 reaches the EC-release region and releases one or more ECs 66. Each of the blades 166 has, in a radial direction of the lifter 146, a length which assures that the each blade 166 does not interfere with the clearing member 172.

The two upper surfaces 184, 186 of the movable clearing member 172 are inclined such that as the surfaces 184, 186 extend downward, they approach the conveyor belt 118. While the clearing member 172 is positioned at its retracted position, the inclined surfaces 184, 186 function as guide surfaces which guides the ECs 66 supplied from the EC case 68, toward the belt 118. Thus, the clearing member 172 also functions as a guide member. As shown in FIGS. 2 and 3, the clearing member 172 cooperates with another guide member 210 provided in the housing 60, to provide a guide device 212. In the housing 60, the guide member 210 is provided above the clearing portion 176 of the clearing member 172, and has two inclined guide surfaces 214, 216. The first guide surface 214 is opposite to the lifter 146 with respect to the inside pulley 112, is offset from the belt 118, and is inclined such that as the surface 214 extends downward, it approaches the belt 118. The second guide surface 216 is provided above the belt 118, is continuous with the first guide surface 214 along an inclined straight line offset from the belt 118, and is inclined such that as the surface 216 extends downward, it extends in a direction opposite to the EC-feed direction.

The rotatable lifter 146, the inside pulley 112, the conveyor belt 118, and the guide member 210 are provided in the inner space of the housing 60. A bottom surface 220 of a two-third portion of the inner space in which the pulley 112 and the guide member 210 are provided is defined by a portion of a conical surface whose center line coincides with the axis line of rotation of the pulley 112. A bottom line of the bottom surface 220 is substantially aligned with a portion of the cylindrical portion 162 of the lifter 146. Therefore, the ECs 66 which have been supplied to the housing 60 and have not been accommodated in the pockets 120 of the belt 118, e.g., the ECs 66 which have been cleared by the clearing member 172 from the belt 118, and/or the ECs 66 which have been guided by the guide device 212 and have not ride on the horizontal portion 122 of the belt 118 in which the pockets 120 open upward, are guided by the bottom surface 220 into the cylindrical portion 162 of the lifter 146 and are kept in the same 162.

An EC-mount sensor 222 as an object sensor is provided at a predetermined height position as measured from the lowest position of the bottom surface 220 of the housing 60. The predetermined height position is slightly higher than the upper end of each blade 166 when the each blade 166 is positioned at the lowest position on the locus of revolution thereof. When the amount of the ECs 66 present in the lifter 146 decreases to such an extent that the upper surface of the ECs 66 stored in bulk is lower than the upper end of each blade 166 being positioned at the lowest position of the locus of revolution thereof, the each blade 166 may possibly scoop all the ECs 66 at once. Therefore, if the EC-amount sensor 222 is provided at a height position lower than the upper end of each blade 166 being positioned at the lowest position of the locus of revolution thereof, the sensor 222 may not possibly detect the shortage of the ECs 66 before the number of the ECs 66 decreases to zero. In the present embodiment, the EC-amount sensor 222 is provided by a reflection-type photoelectric switch as a sort of photoelectric sensor that includes a light emitter and a light receiver, and produces a first signal when the light receiver receives or detects the light emitted by the light emitter and reflected by the ECs 66, and a second signal different from the first signal when the light receiver does not receive the light emitted by the light emitter or reflected by the ECs 66.

The present EC mounting machine is controlled by a control device 230 shown in FIG. 1. The control device 230 is essentially provided by a computer including a processing unit (PU), a read only memory (ROM), a random access memory (RAM), and a bus connecting between those elements. The control device 230 receives the signals supplied from the EC sensor 138 and the EC-amount sensor 222, and controls the index servomotor 26, the X-axis servomotor 50, the servomotors 126, 156, and the escape-member drive device 78. Each of the servomotors 26, 50, 126, 156 is an electric motor as a sort of drive source that is accurately controllable with respect to its rotation amount or angle and its rotation speed, and may be replaced with a stepper motor.

Next, there will be described the operation of the present EC mounting machine constructed as described above.

When the ECs 66 are mounted on the PWB 18, first, the X-axis table 44 is moved so that the respective EC-supply portions of the EC feeders 12 attached to the table 44 are selectively positioned at the position right below the EC-suck head 22 being positioned at the EC-suck position, and supply the ECs 66 to the EC-suck heads 22 of the EC mounting system 14. In each EC feeder 12, the conveyor belt 118 is circulated so that the ECs 66 accommodated in the pockets 120 are positioned one by one at the EC-supply position belonging to the EC-supply portion. The conveyor belt 118 is regularly fed forward, as a general rule, at a predetermined pitch equal to the predetermined pitch at which the pockets 120 are regularly formed in the belt 118, so that the ECs 66 are positioned one by one at the EC-supply position. That is, the inside pulley 112 is regularly rotated at a predetermined angular pitch corresponding to the pitch at which the pockets 120 are formed in the belt 118. Simultaneously, the EC sensor 138 detects or inspects whether an EC 66 is present in the pocket 120 being positioned at the EC-detect position.

When the EC sensor 138 detects that no EC 66 is present in the pocket 120 being positioned at the EC-detect position, the empty pocket 120 is not stopped at the EC-supply position, and the conveyor belt 118 is continuously fed forward by a distance equal to two or more pitches until the pocket 120 filled with the EC 66 reaches the EC-supply position. When the belt 118 is continuously fed forward by a distance equal to two or more pitches, the EC sensor 138 can inspect whether an EC 66 is present in each pocket 120 being positioned at the EC-detect position, while the each pocket 120 is being moved without being stopped at the EC-detect position. Based on the amount of operation of the belt drive device 124 or the servomotor 126, the control device 230 can determine the current position of each pocket 120 relative to the EC-detect position where the EC sensor 138 has inspected whether an EC 66 is present in the each pocket 120, or relative to the EC-supply position, and accordingly can determine an amount of movement or feeding of the belt 118 that is needed to move the each pocket 12 to the EC-supply position.

After the EC-supply portion of the EC feeder 12 is positioned at the position right below the EC-suck head 22 being positioned at the EC-suck position, and supplies the EC 66 to the head 22, the conveyor belt 118 is fed forward and simultaneously the lifter 146 is rotated. Thus, some of the ECs 66 kept in the cylindrical portion 162 of the lifter 146 are scooped by one blade 166, and then conveyed upward, as the lifter 146 is rotated. When the one blade 166 reaches the EC-release region, the ECs 66 fall from the blade 166.

As described previously, each blade 166 releases one or more ECs 66 at a timing different from a timing at which the clearing member 172 clears one or more ECs 66 from the conveyor belt 118. That is, when each blade 166 releases the ECs 66, the clearing member 172 is positioned at its retracted position, and the ECs 66 released from the each blade 166 fall onto the upper surfaces 184, 186 and are guided by the inclination of the same 184, 186, so that the ECs 66 are introduced onto the horizontal portion 122 of the belt 118 in which the pockets 120 open upward, and are accommodated in those pockets 120.

When one roller 200 engages the cam surface 198 after one blade 166 releases one or more ECs 66, the clearing member 172 is moved to its clearing position, so that the part-annular portion 180 and the linear portion 182 of the clearing portion 176 engage one or more ECs 66 which have not been accommodated in the pockets 120 and are present on the belt 118, and push the ECs 66 off the belt 118. Thus, the clearing portion 176 clears the ECs 66 from the belt 118. Thus, the inclined upper surfaces 184, 186 of the clearing portion 176 not only guide the ECs 66 but also clear the ECs 66. The ECs 66 cleared from the belt 118 are guided by the inclined bottom surface 220 and are kept in the cylindrical portion 162 of the lifter 146. When the one roller 200 is disengaged from the cam surface 198, the clearing member 172 is moved to its retracted position by the biasing action of the coil spring 192. Then, another blade 166 reaches the EC-release position and releases one or more ECs 66 onto the inclined surfaces 184, 186. The lifter 146 is continuously rotated while the EC feeder 12 supplies the ECs 66 to the EC mounting system 14, and is rotated for a predetermined time after the feeder 12 finishes the supplying of ECs 66. However, the lifter 146 may be intermittently rotated, i.e., may be regularly rotated at a predetermined angular pitch.

When the amount of the ECs 66 present in the lifter 146 decreases to such an extent that the upper surface of the ECs 66 stored in bulk is lower than the height position where the EC-amount sensor 222 is provided, the light receiver of the sensor 222 cannot receive the light emitted by the light emitter, i.e., cannot detect any ECs 66, and produces an electric signal representing that the amount of ECs 66 is short. If the sensor 222 continues producing the EC-shortage signal for not less than a predetermined time, the control device 230 operates the escape-member drive device 78 to pivot the escape member 76 to its EC-supply position. Thus, the upper shut projection 90 of the escape member 76 is moved to its shutting position, and the lower shut projection 92 is moved to its opening position, so that the ECs 66 kept by the escape member 76 fall into the housing 60. The ECs 66 are guided by the inclined upper surfaces 184, 186 and are introduced onto the conveyor belt 118. The ECs 66 which have failed to ride on the belt 118 are guided by the inclined bottom surface 220, and are kept in the lifter 146.

In the case where the supplying of ECs 66 from the EC case 68 to the housing 60 occurs during the supplying of ECs 66 from the EC feeders 12 to the EC mounting system 14, the lifter 146 is being rotated. In this case, the ECs 66 which have been supplied from the EC case 68, have not been accommodated in the pockets 120, and are present on the conveyor belt 118, are cleared off the belt 118 by the clearing member 172. In the case where the supplying of ECs 66 from the EC case 68 occurs while the EC feeder 12 does not supply the ECs 66, the lifter 146 is rotated for a predetermined time after the supplying of ECs 66 from the case 68, so that one or more ECs 66 are cleared off the belt 118 by the clearing member 172. However, in the latter case, it is otherwise possible that when the EC-amount sensor 222 detects the shortage of the ECs 66, the escape member 76 be not immediately operated, but be operated when the EC feeder 12 starts supplying the ECs 66. In a state in which all the ECs 66 kept by the escape member 76 would probably have fallen into the housing 60, for example, in a state at a predetermined time after the escape member 76 is moved to its EC-supply position, the member 76 is moved back to its EC-receive position where the member 76 again receives and keeps a substantially constant amount of ECs 66. Since the escape member 76 is formed of rubber, no ECs 66 that might be pinched between the upper or lower shut projection 90, 92 and the opposite side wall of the case attaching device 64 are damaged. In addition, no ECs 66 would unexpectedly pass through a space which would otherwise be created by one or more ECs 66 pinched between the projection 90, 92 and the opposite side wall.

As is apparent from the foregoing description, in the present embodiment, a portion of the control device 230 that controls the servomotor 126 provides a belt-drive-device control device; and a portion of the control device 230 that controls, when the EC-amount sensor 222 has produced the EC-amount-shortage signal for not less than a predetermined time, the escape-drive device 78 to pivot the escape member 76 to its EC-supply position, provides an object-amount-control-device control device, which cooperates with the EC-amount sensor 222 to provide an object-amount-shortage detecting device. The EC-amount control device 74 can be thought as a constant-amount supplying device.

Figure 8:
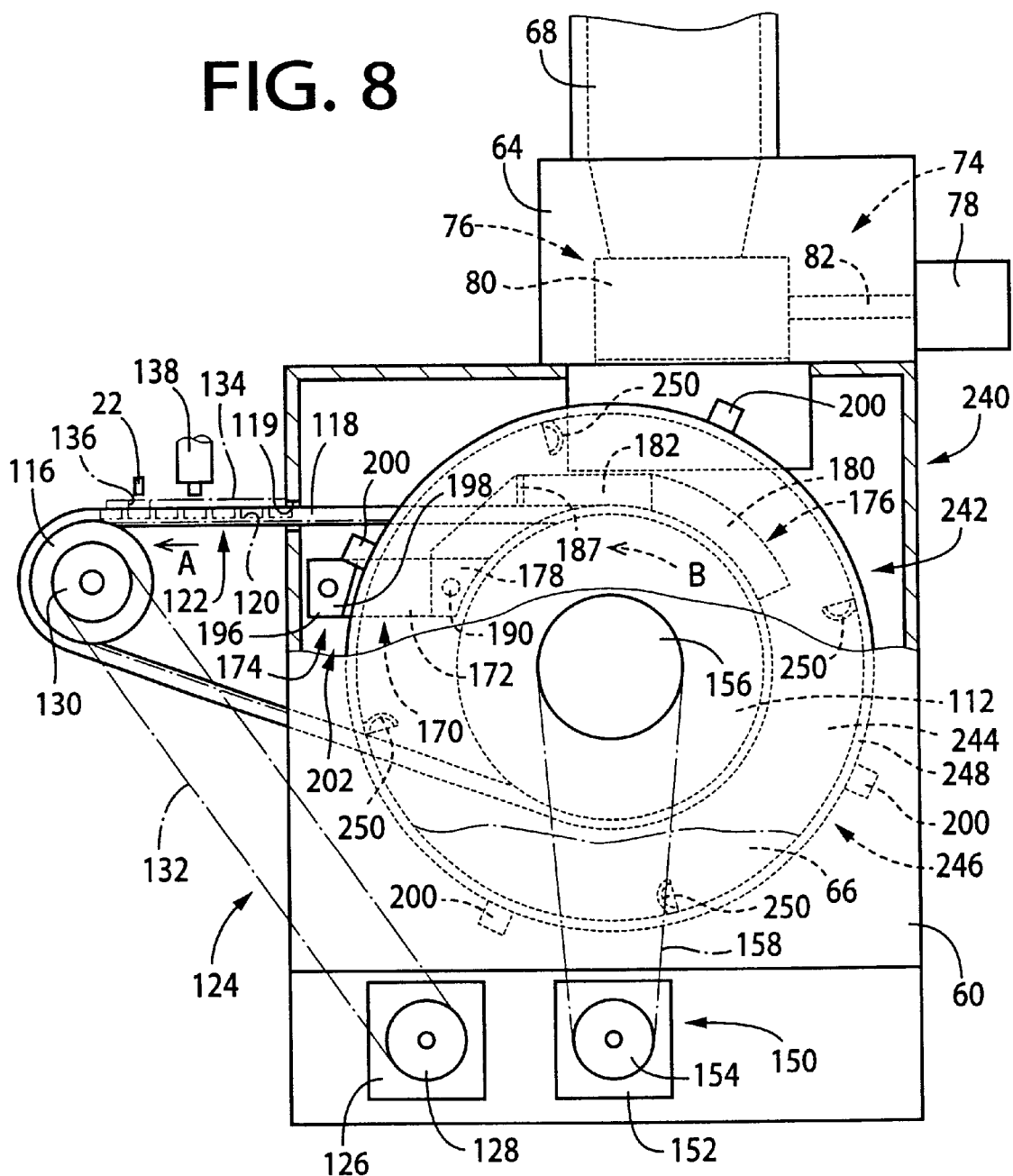
FIG. 8 is a partly cut away, front elevation view of another EC feeder as a second embodiment of the present invention.

In the first embodiment shown in FIGS. 1 to 7, the blades 166 of the rotatable lifter 146 provide holders of the circulative lifter. However, the blades 166 may be replaced with buckets as shown in FIG. 8. FIG. 8 shows a second embodiment of the present invention that relates to an EC feeder 240 including a rotatable lifter 242. The lifter 242 of the EC feeder 240 is identical with the lifter 146 of the EC feeder 12, except that the lifter 242 includes, as the holders, buckets 250 in place of the blades 166 of the lifter 146. The lifter 240 includes a rotatable drum 246 including a circular portion 244 and a cylindrical portion 248. A plurality of (e.g., four) buckets 250 are supported by an inner circumferential surface of the cylindrical portion 248. Each bucket 250 has the same shape as that of one of two members which are obtained by cutting a hollow spherical member along a plane which does not pass through its center, said one member not including the center. Each bucket 250 opens on a downstream side thereof as seen in the direction of rotation of the lifter 242, and extends from the inner surface of the cylindrical portion 248 in a direction perpendicular to the axis line of rotation of the lifter 242. The same reference numerals as used in the first embodiment are used to designate the corresponding elements and parts of the second embodiment, and the description thereof is omitted.

When each bucket 250 passes along a lower portion of the locus of revolution thereof, it scoops some ECs 66 kept in the lifter 242, and moves the ECs 66 upward as the lifter 242 is rotated. When the each bucket 250 reaches an EC-release region above the movable clearing member 172 as the lifter 242 is further rotated. In the EC-release region, an inner half portion of the part-spherical inner surface of the each bucket 250 that is nearer to the axis line of rotation of the lifter 242 is positioned below an outer half portion thereof remoter from the axis line, so that the ECs 66 held by the bucket 250 slide on the inner surface of the bucket 250, fall from the bucket 250 onto the inclined upper surfaces 184, 186 of the clearing member 172, and are guided onto the conveyor belt 118.

Figure 9:
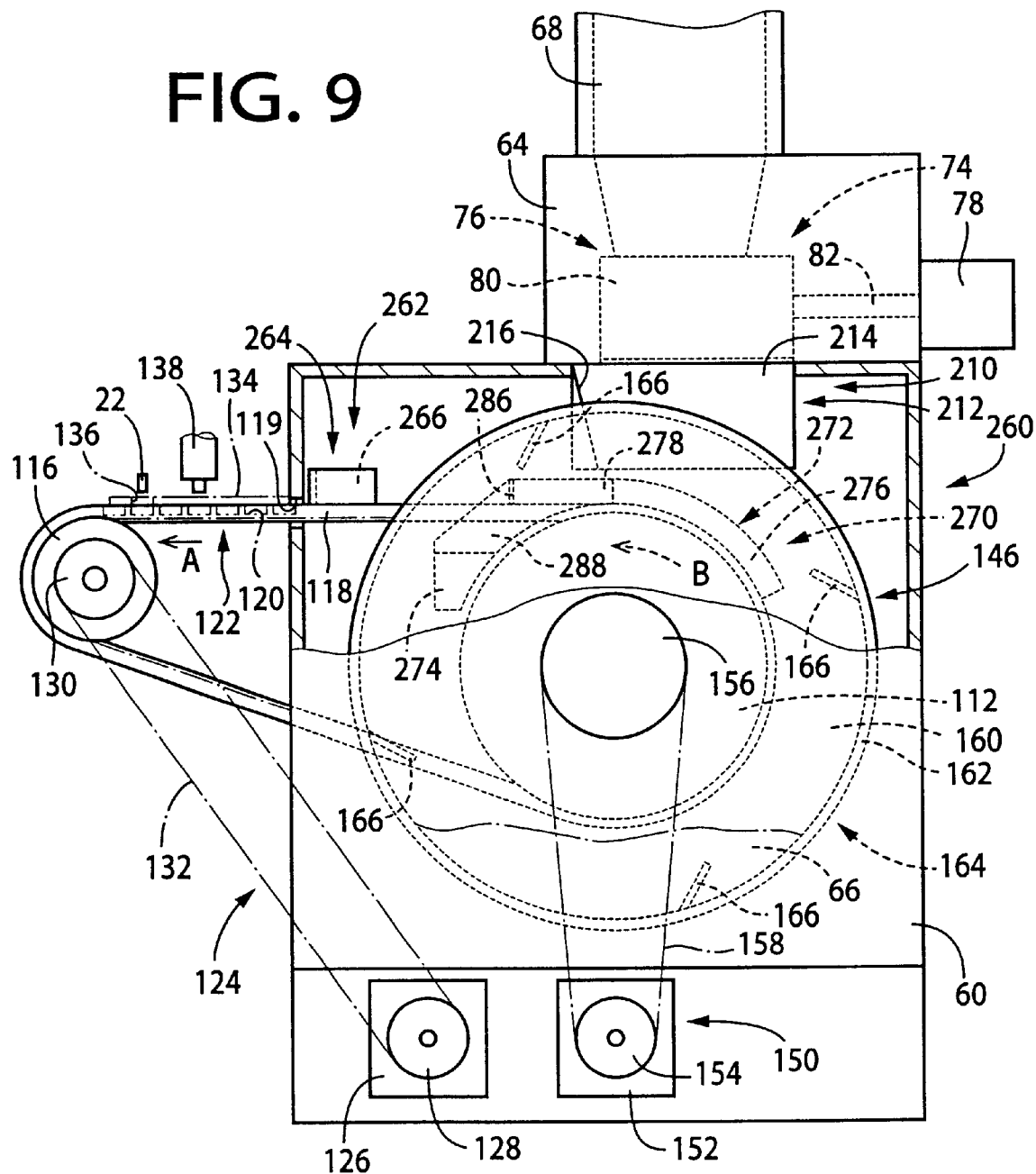
FIG. 9 is a partly cut away, front elevation view of another EC feeder as a third embodiment of the present invention.
Figure 10:
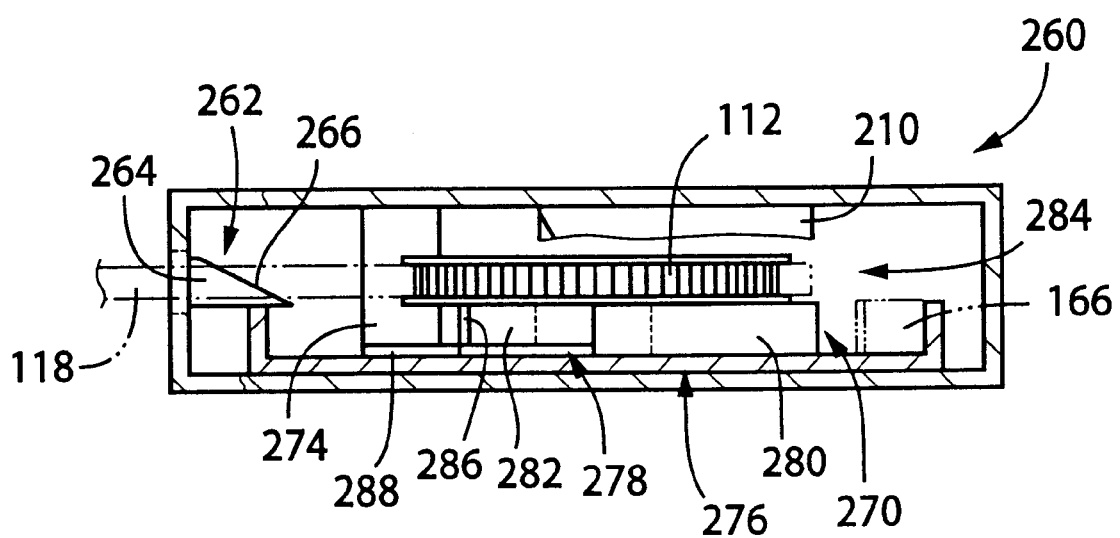
FIG. 10 is a partly cross-sectioned, plan view of a rotatable lifter and a clearing device of the EC feeder of FIG. 9.

In each of the first and second embodiments, the clearing device 170 includes the movable clearing member 172. However, the clearing device 170 may include a stationary clearing member which is fixed in position, as shown in FIGS. 9 and 10. FIGS. 9 and 10 show a third embodiment of the present invention that relates to an EC feeder 260 which includes a clearing device 262 including a stationary clearing member 264. The stationary clearing member 264 is supported by a side wall of the housing 60, at a position above an intermediate portion of the horizontal portion 122 of the belt 118 that is remote from the inside pulley 112, such that a distance between the clearing member 264 and the upper surface of the horizontal portion 122 is smaller than the height (i.e., thickness) of each EC 66. The stationary clearing member 264 has a vertical clearing surface 266 which is inclined such that as the surface 266 extends in the direction of movement of the horizontal portion 122, it extends from the side of the lifter 146 toward the side of the first guide member 210 across the width of the belt 118.

The EC feeder 260 additionally employs a second guide member 270 which is provided at a position where the movable clearing member 172 is provided in each of the first and second embodiments. The guide member 270 includes a guide portion 272 corresponding to the clearing portion 176 of the clearing member 172, and a support portion 274 corresponding to the support portion 178 of the member 172. The guide portion 272 is entirely located in the inner space of the cylindrical portion 162 of the lifter 136, and the support portion 274 extends from the guide portion 272, out of the lifter 146, at a position below the horizontal portion 122 of the belt 118, and is fixed to the housing 60. The guide portion 272 includes a part-annular guide portion 276 and a linear guide portion 278 which have respective inclined guide surfaces 280, 282 each of which extends downward as it approaches the belt 118. The guide surfaces 280, 282 guide, toward the upper surface of the belt 118, the ECs 66 which have been conveyed by the blades 166 and released from the same 166. The inclined guide surface 280 is defined by a portion of a conical surface whose centerline coincides with the axis line of rotation of the lifter 146. The second guide member 270 cooperates with the first guide member 210 to provide a guide device 284. Reference numeral 286 designates a vertical wall which projects upward from one end of the linear guide portion 278 and which functions like the vertical wall 187 shown in FIG. 2, and reference numeral 288 designates a connection plate 288 which connects between the guide portion 272 and the support portion 274, like the connection plate 188 shown in FIG. 4.

One or more ECs 66 which are present on the conveyor belt 118 and are not accommodated in the pockets 120 eventually engage the inclined clearing surface 266 as the belt 118 is fed forward and, because of the effect of inclination of the clearing surface 266, are moved in a direction perpendicular to the direction of feeding of the belt 118 and away from the lifter 146, so as to fall off the belt 118.

In each of the first to third embodiments shown in FIGS. 1 to 10, the circulative lifter is provided by the rotatable or rotary lifter 146, 242. However, it is possible that the circulative lifter be provided by a circulative belt lifter as shown in FIGS. 10 to 13. FIGS. 10 to 13 show a fourth embodiment relating to an EC feeder 300. The same reference numerals as used in the first and third embodiments shown in FIGS. 1 to 7 and FIGS. 9 and 10 are used to designate the corresponding elements and parts of the fourth embodiment.

The EC feeder 300 includes a housing 302 in which a second inside pulley 306 as a sort of rotatable member is rotatably supported via a bearing 308 by a support shaft 304 by which the first inside pulley 112 is rotatably supported. Thus, the second pulley 306 is concentric with the first pulley 112, is rotatable about the common horizontal axis line about which the first pulley 112 is rotatable, is provided in tandem with the first pulley 112 in a direction parallel to the common axis line, and has the same diameter as that of the first pulley 112. In the housing 302, a third inside pulley 310 as a sort of rotatable member is provided below the second pulley 306 such that the third pulley 310 is rotatable about a horizontal axis line parallel to the common axis line of rotation of the first and second pulleys 112, 306. An endless annular lifting belt 312 is wound on the second and third pulleys 306, 310. The lifting belt 312 is formed of a rubber as a sort of non-magnetic material. A number of permanent magnets 314 are embedded in an outer circumferential surface of the belt 312, such that the magnets 314 are distant from one another at a regular interval of distance, i.e., at a predetermined pitch, in a lengthwise direction of the belt 312. A portion of the lifting belt 312 is wound on the second pulley 306, and that portion of the belt 312 is partly aligned with a portion of the conveyor belt 118 that is wound on the first pulley 112, as seen in the X-axis direction. The second and third pulleys 306, 310 and the lifting belt 312 cooperate with one another to provide a belt lifter 316. When the third pulley 310 is rotated by a servomotor 318 as a drive source, the lifting belt 312 is circulated on a vertical plane. The servomotor 318 provides a lifter drive device which drives the belt lifter 316. In the fourth embodiment, the third pulley 310 is so rotated as to rotate the second pulley 306 in the same direction as that in which the first pulley 112 is rotated. However, the third pulley 310 may be so rotated as to rotate the second pulley 306 in a direction opposite to the direction in which the first pulley 112 is rotated.

In the fourth embodiment, each of the lifting belt 312 and the conveyor belt 118 has a stepped cross section including a central projecting portion, and the central projecting portion of the each belt 312, 118 is engaged with the groove of a corresponding one of the second and first pulleys 306, 112. The width of the central projecting portion of the each belt 312, 118 is narrower than the entire width of the each pulley 306, 112, and the entire width of the each belt 312, 318 is equal to that of the each pulley 306, 112. Thus, the two belts 312, 118 are closely adjacent to each other, with no substantial space left therebetween, in a direction parallel to the common axis line of rotation of the pulleys 306, 112.

Figure 11:
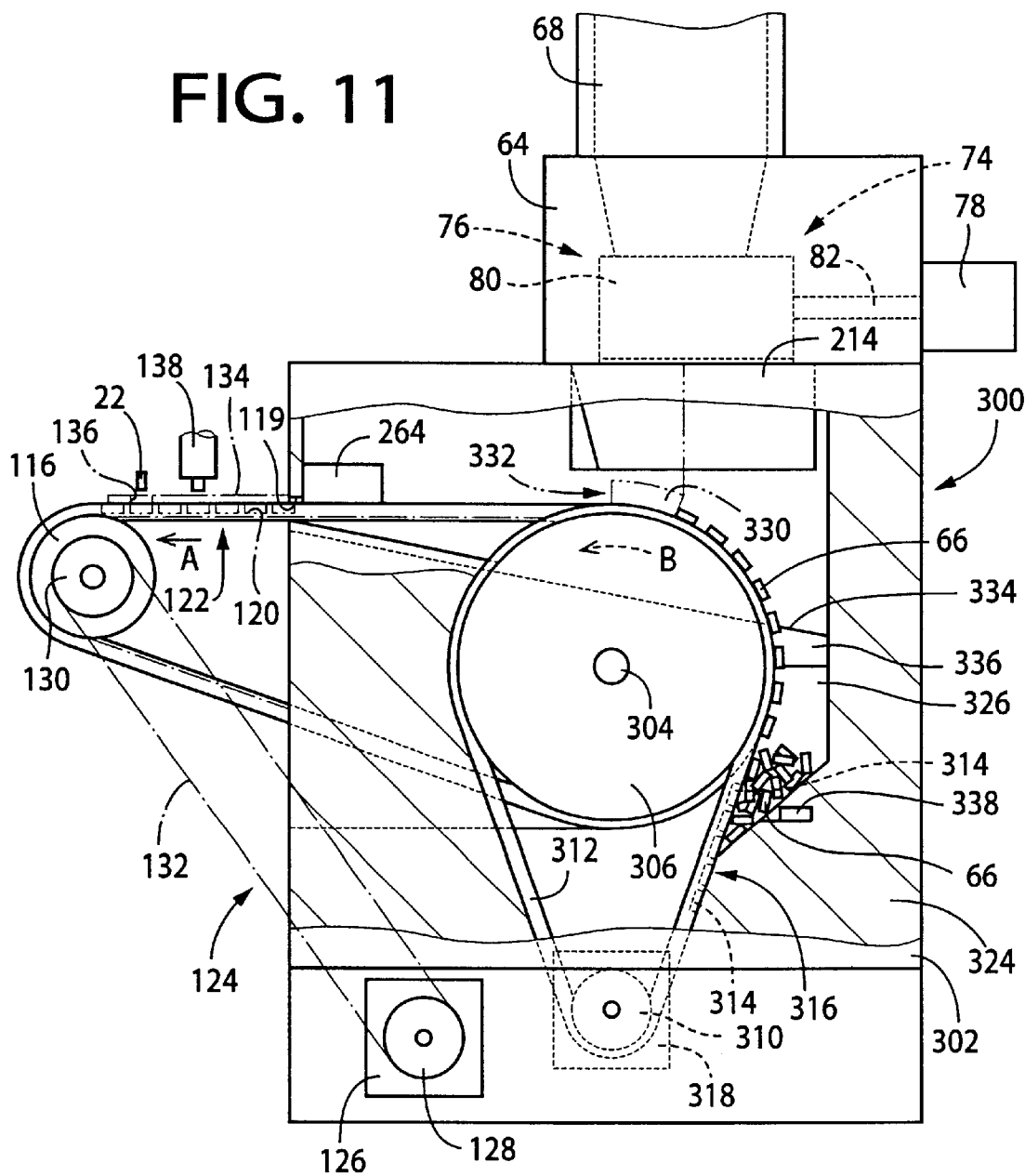
FIG. 11 is a partly cross-sectioned, front elevation view of another EC feeder as a fourth embodiment of the present invention.
Figure 12:
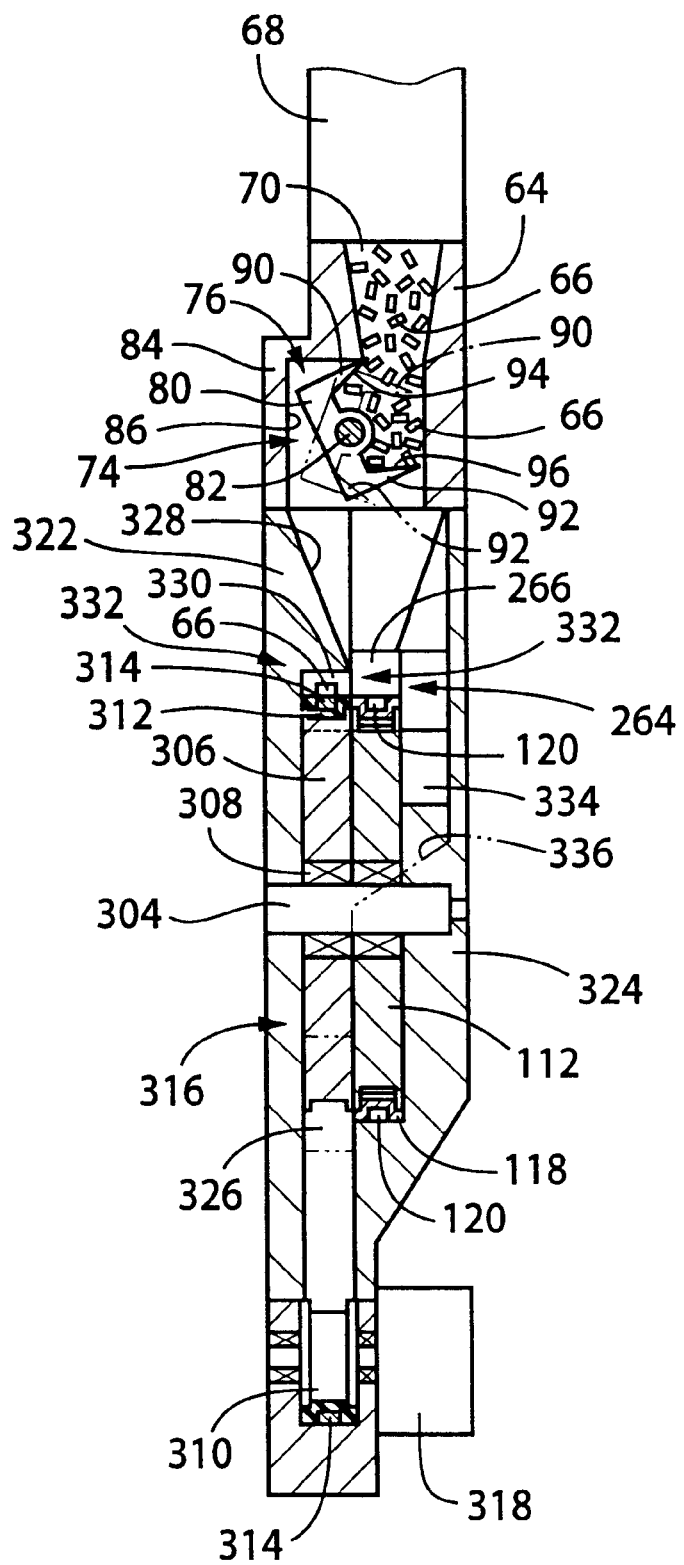
FIG. 12 is a partly cross-sectioned side elevation view of the EC feeder of FIG. 11.
Figure 13:
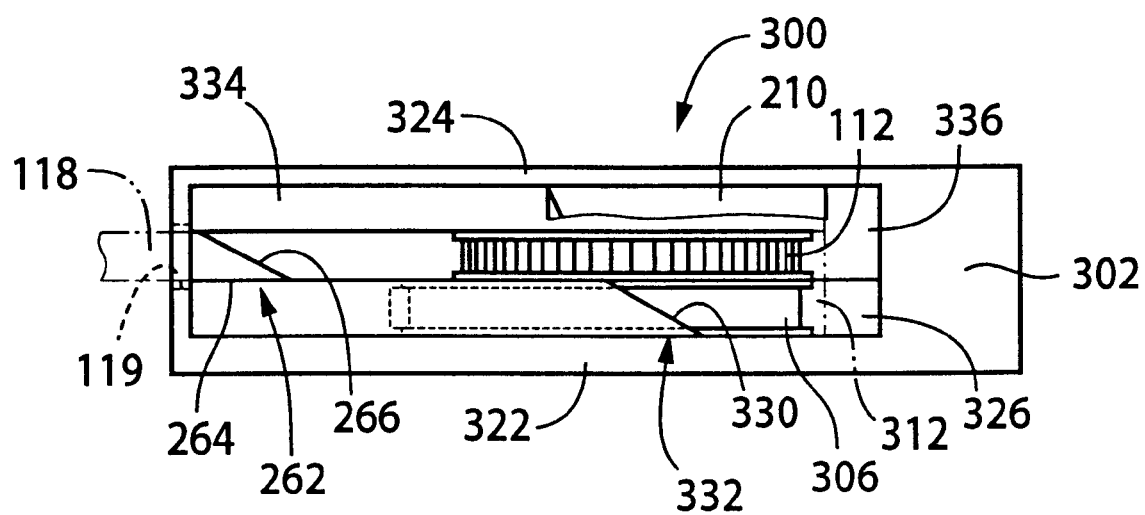
FIG. 13 is a plan view of a conveyor belt of the EC feeder of FIG. 11.

Two side walls 322, 324 of the housing 302 that define the inner space in which the belt lifter 316 and the first pulley 112 are provided, are designed to prevent the ECs 66 from entering an inner space of the annular lifting belt 312. However, in rear of the second pulley 306, i.e., on an upstream side of the horizontal portion 122 of the conveyor belt 118 as seen in the EC-feed direction, there is provided, as shown in FIG. 11, an EC-store room 326 which stores the ECs 66 which have not been accommodated in the pockets 120 of the belt 118. An upper portion of an inner surface of the side wall 322 that is located above the lifting belt 312 provides, as shown in FIG. 12, an inclined guide surface 328 which is inclined such that the surface 328 extends downward as its approaches the belt 118. In addition, the side wall 322 has a deflecting surface 330 which is located at a position corresponding to the highest portion of the lifting belt 312 and which is inclined, as shown in FIG. 13, such that the surface 330 extends in a direction from the side wall 322 toward the belt 118 as it extends in the direction of rotation of the second pulley 306, indicated at arrow "B" in FIG. 11. A portion of the side wall 332 that defines the deflecting surface 330 provides a deflector 332.

The stationary clearing member 264 is supported by the housing 302, at a position above the horizontal portion 122 of the conveyor belt 118. The side wall 324 of the housing 302 has an inclined surface 334 which guides the ECs 66 cleared from the belt 118 by the clearing member 264, toward the EC-store room 326, and an inclined surface 336 which connects between the inclined surface 334 and the EC-store room 326 and guides the ECs 66 to the room 326. In addition, an EC-amount sensor 338 is supported by a portion of the housing 302 that defines the EC-store room 326, at a position slightly higher than the bottom of the room 326. In the present embodiment, the EC-amount sensor 338 is provided by a reflection-type photoelectric switch as described previously.

When the EC feeder 300 supplies the ECs 66, the third pulley 310 is rotated so that the lifting belt 312 is circulated. When the belt 312 is circulated, the ECs 66 stored in the EC-store room 326 are attracted by the permanent magnets 314, and are conveyed upward as the belt 312 is moved. Subsequently, the ECs 66 engage the deflecting surface 330 of the deflector 332 and, because of the effect of inclination of the deflecting surface 330, are moved toward the conveyor belt 118. Since the ECs 66 are thus released from the attraction of the permanent magnets 314, the ECs 66 are transferred from the lifting belt 312 to the conveyor belt 118, and are accommodated by the pockets 120 of the belt 118. One or more ECs 66 which are not accommodated in the pockets 120 and are present on the belt 118 are cleared off the belt 118 by the stationary clearing member 264, then are guided by the inclined surfaces 334, 336, and are stored in the EC-store room 326. When the amount of ECs 66 stored in the room 326 decreases little by little and the shortage of the ECs 66 is detected by the EC-amount sensor 338, the control device 230 operates for pivoting the escape member 76 to its EC-supply position and thereby supplying the ECs 66 to the housing 302.

In the fourth embodiment, the ECs 66 are transferred from the curved portion of the lifting belt 312 that is wound on the second pulley 306, as shown in FIG. 11, onto the conveyor belt 118. However, it is possible to provide a conveyor belt and a lifting belt such that the two belts have respective straight portions and ECs are transferred from the straight portion of the lifting belt to that of the conveyor belt. For example, each of a conveyor belt and a lifting belt is wound on three or more pulleys so that the two belts have respective straight portions which are horizontal or are slightly inclined relative to a horizontal plane and which are arranged in tandem in a direction parallel to the axis line of rotation of the pulleys.

In the fourth embodiment, the deflector 332 is provided by a portion of the side wall 332 of the housing 302. However, the deflector may be provided by a member separate from the side wall 332.

In the fourth embodiment, the permanent magnets 314 are embedded in the outer surface of the lifting belt 312. However, the magnets 314 may be embedded in an inner surface of the belt 312 to convey the ECs 66.

In addition, the lifting belt 312 may be formed of a magnetic rubber so as to function as a permanent magnet. In this case, one of an outer and an inner surface of the lifting belt 312 provides an N pole, and the other surface provides an S pole.

Figure 14:
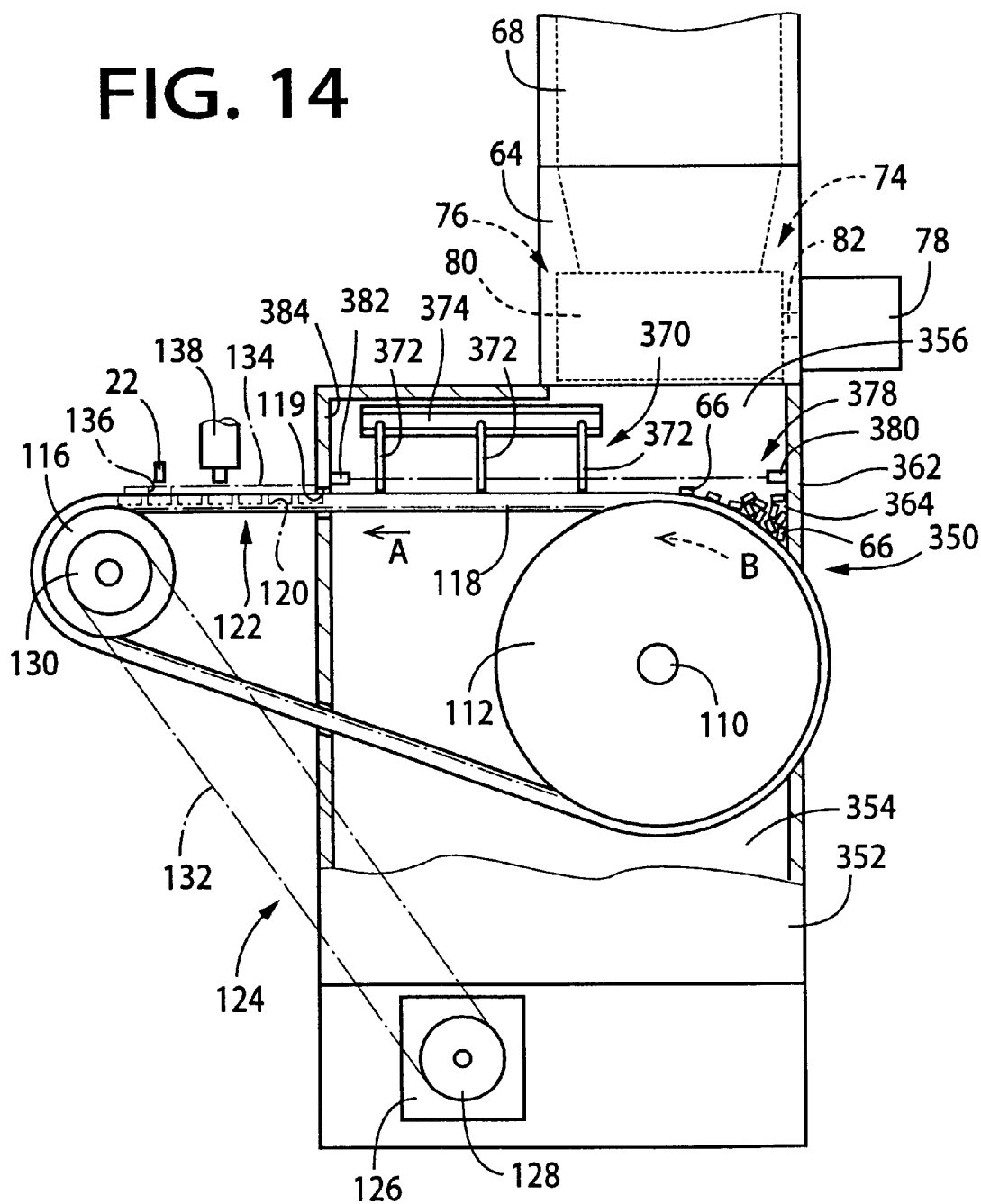
FIG. 14 is a partly cut away, front elevation view of another EC feeder as a fifth embodiment of the present invention.
Figure 15:
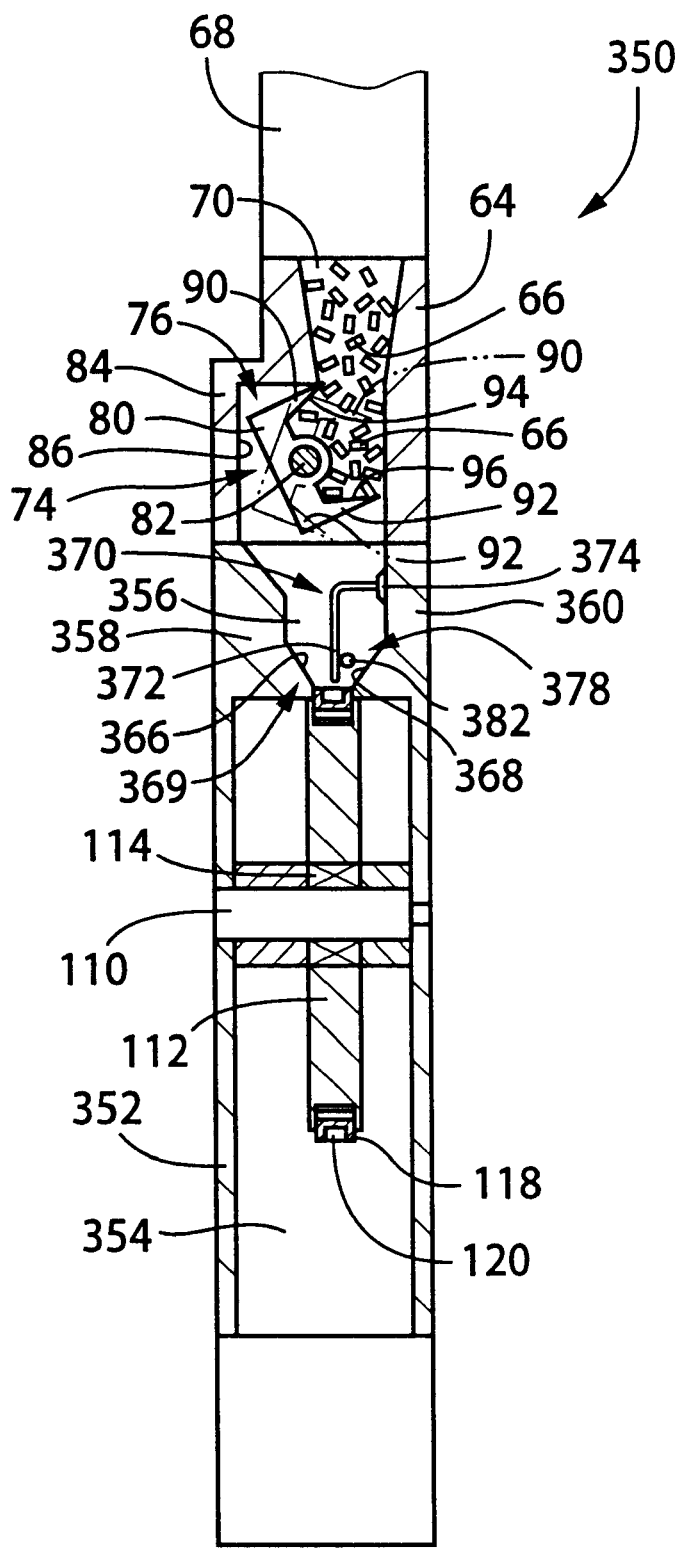
FIG. 15 is a partly cross-sectioned side elevation view of the EC feeder of FIG. 14.
Figure 16:
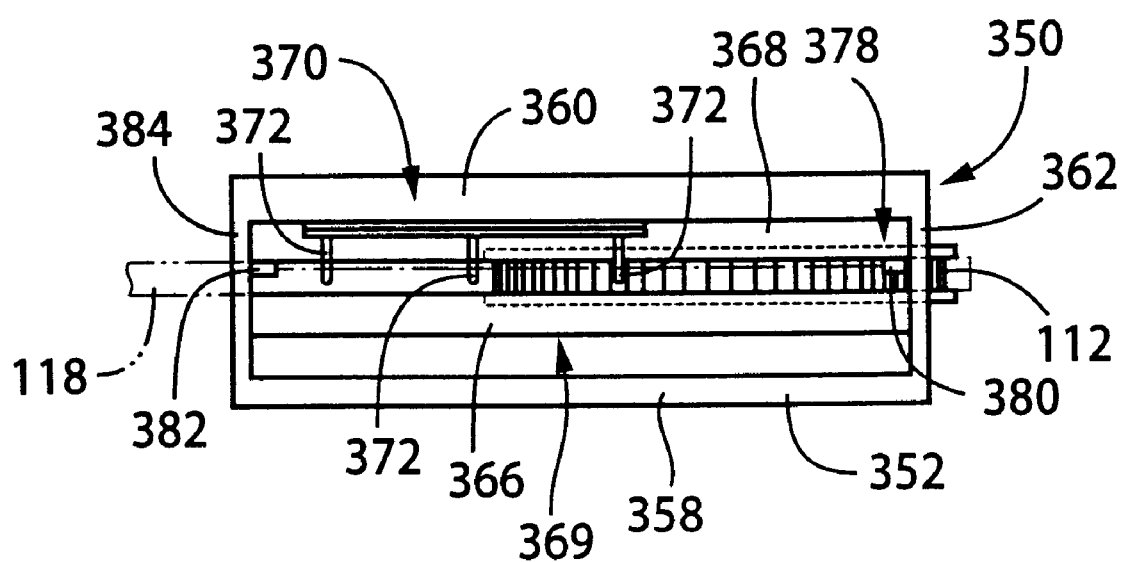
FIG. 16 is a plan view of a rotatable lifter and a clearing device of the EC feeder of FIG. 14.

In each of the first to fourth embodiments, the circulative lifter is provided by the rotatable lifter 146, 242 or the belt lifter 316. However, it is possible to omit the circulative lifter. FIGS. 14, 15, and 16 show a fifth embodiment relating to an EC feeder 350 which does not employ an circulative lifter. The same reference numerals as used in the first embodiment shown in FIGS. 1 to 7 are used to designate the corresponding elements and parts of the fifth embodiment.

The EC feeder 350 includes a housing 352 which has, as shown in FIG. 14, a pulley-accommodate room 354 which accommodates the inside pulley 112 such that the pulley 112 is rotatable. In addition, the housing 352 has an EC-store room 356 which stores the ECs 66. The two rooms 353, 356 are elongate in the EC-feed direction indicated at arrow "A" in FIG. 14. As shown in FIG. 15, respective lower portions of two side walls 358, 360 which extend parallel to the EC-feed direction and which cooperate with each other to define the EC-store room 356, have respective inclined guide surfaces 366, 368 which are inclined such that the surfaces 366, 368 extend downward as they approach the conveyor belt 118. Respective lower ends of the two inclined guide surfaces 366, 368 are adjacent to widthwise opposite ends of the belt 118, respectively, without any spaces left therebetween. Thus, the two side walls 358, 360 are opposed to each other in a state in which a space in which the belt 118 is provided is left therebetween. Therefore, the ECs 66 supplied from the EC case 68 are guided by the inclined guide surfaces 366, 368, and are stored in the EC-store room 356, without falling into the pulley-accommodate room 354. The two inclined guide surfaces 366, 368 cooperate with each other to provide a guide device 369.

The conveyor belt 118 defines a bottom surface of the EC-store room 356. The EC-store room 356 extends to an upstream side of the axis line of rotation of the inside pulley 112 as seen in the EC-feed direction, and includes an EC reservoir 364 which is located at a level lower than the horizontal portion 122 of the belt 118 and which is defined by, and between, a curved portion of the belt 118 that is wound on the pulley 112 and a vertical side wall 362 that is perpendicular to the EC-feed direction and is located on an upstream side of the axis line of rotation of the pulley 112.

A clearing device 370 is provided inside the EC-store room 356. The clearing device 370 includes a plurality of (e.g. three) clearing arms 372 each as a clearing member. In the fifth embodiment, the clearing arms 372 are provided by bar-shaped springs each as a sort of spring wire rod as a sort of elastic member. An arm holder 374 holds the clearing arms 372 at a regular interval of distance in a direction parallel to the EC-feed direction. Thus, the clearing arms 372 are detachably attached to the housing 352 via the arm holder 374. The clearing arms 372 extend from the side wall 360 defining the EC-store room 356, in a horizontal direction parallel to the upper surface of the conveyor belt 118, and are bent downward to extend in a vertical direction perpendicular to the upper surface of the belt 118, so that respective free ends of the clearing arms 372 are positioned at a height position which is higher than the upper surface of the belt 118 by a small distance smaller than the height or thickness of each EC 66.

In addition, an EC-amount sensor 378 is provided in the EC-store room 356. In the present embodiment, the EC-amount sensor 378 is provided by a transmission-type photoelectric switch as a sort of photoelectric sensor that includes a light emitter 380 and a light receiver 382 which are supported by the side wall 362 and a fourth side wall 384, respectively, that are opposed to each other in the EC-feed direction. The optical axis of the light emitter and receiver 380, 382 extends parallel to the EC-feed direction, at a height position which is higher than the upper surface of the conveyor belt 118 by a distant equal to the sum of respective heights of a plurality of (e.g., three) ECs 66. The optical axis is also offset from the straight line along which the three clearing arms 372 are arranged, in a horizontal direction perpendicular to the EC-feed direction, so that the optical axis is not interfered with by any of the clearing arms 372. The EC-amount sensor 378 produces a first signal when the light receiver 382 does not receive the light emitted by the light emitter 380 and thereby detects one or more ECs 66 which reflect the light, and produces a second signal different from the first signal when the light receiver 382 receives the light emitted by the light emitter 380 and does not detect any ECs 66 which reflect the light.

When the EC feeder 350 supplies the ECs 66, the inside pulley 112 is rotated in the direction indicated at arrow "B" in FIG. 14, so that the conveyor belt 118 is moved. When the belt 118 passes through the ECs 66 reserved in the EC reservoir 364, some ECs 66 enter some pockets 120 of the belt 118. One or more ECs 66 which are not accommodated in the pockets 120 of the belt 118, are present on the belt 118, and, as the belt 118 is moved forward, are moved with the belt 118 away from the ECs 66 remaining in the EC reservoir 364, are cleared off the belt 118 by the clearing arms 372. Since each clearing arm 372 is provided by the bar-shaped spring, the clearing arm 372 prevents, when its engages the EC 66, the EC 66 from being moved with the belt 118, and is elastically deformed toward a downstream side thereof as seen in the EC-feed direction. Based on an elastic restoring force of the deformed arm 372, the arm 372 pushes the EC 66 toward an upstream side thereof, thereby clearing the EC 66 from the belt 118. The thus cleared EC or ECs 66 are guided by the inclined guide surfaces 366, 368 of the side walls 358, 360, and are moved onto the upper surface of the belt 118, or are reserved in the EC reservoir 364. Since the plurality of clearing arms 372 are employed, every EC 66 is reliably cleared off the belt 118 by either one of the arms 372.

When the amount of ECs 66 stored in the EC-store room 356 decreases to such an extent that the light receiver of the EC-amount sensor 378 receives the light emitted by the light emitter 380 and continues producing the second signal for more than the reference time, the control device 230 operates for pivoting the escape member 76 to its EC-supply position, so that the predetermined amount of ECs 66 are supplied from the escape member 76 to the EC-store room 356. Since the optical axis of the EC-amount sensor 378 is parallel to the EC-feed direction and is vertically distant from the upper surface of the belt 118 by the distance equal to the sum of respective heights of a plurality of ECs 66, the EC-amount sensor 378 can reliably detect that the amount of ECs 66 remaining in the EC reservoir 364 is short, while preventing itself from erroneously producing the first signal when the amount of ECs 66 remaining in the EC reservoir 364 is short, because the optical axis is interfered with by one or more ECs 66 present on the belt 118.

Figure 17:
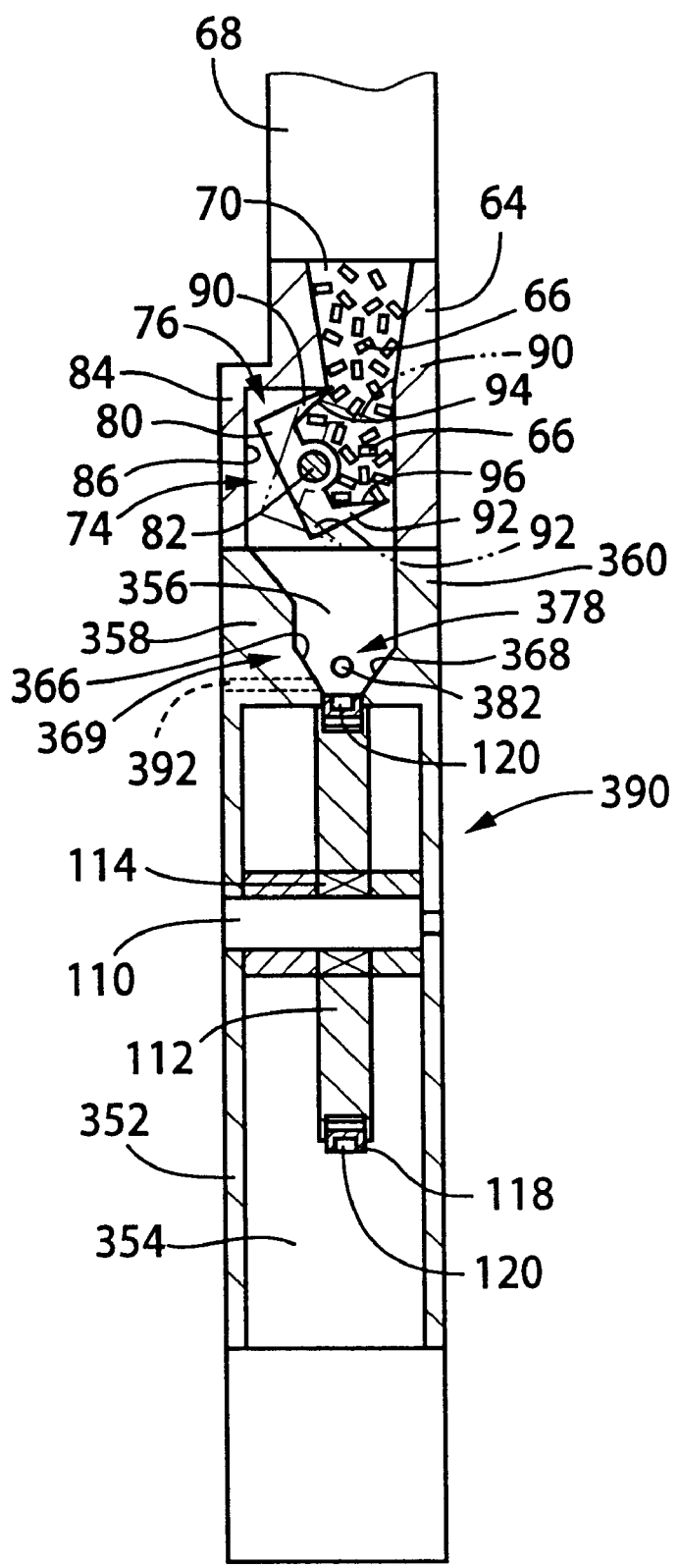
FIG. 17 is a partly cross-sectioned side elevation view of another EC feeder as a sixth embodiment of the present invention.
Figure 18:
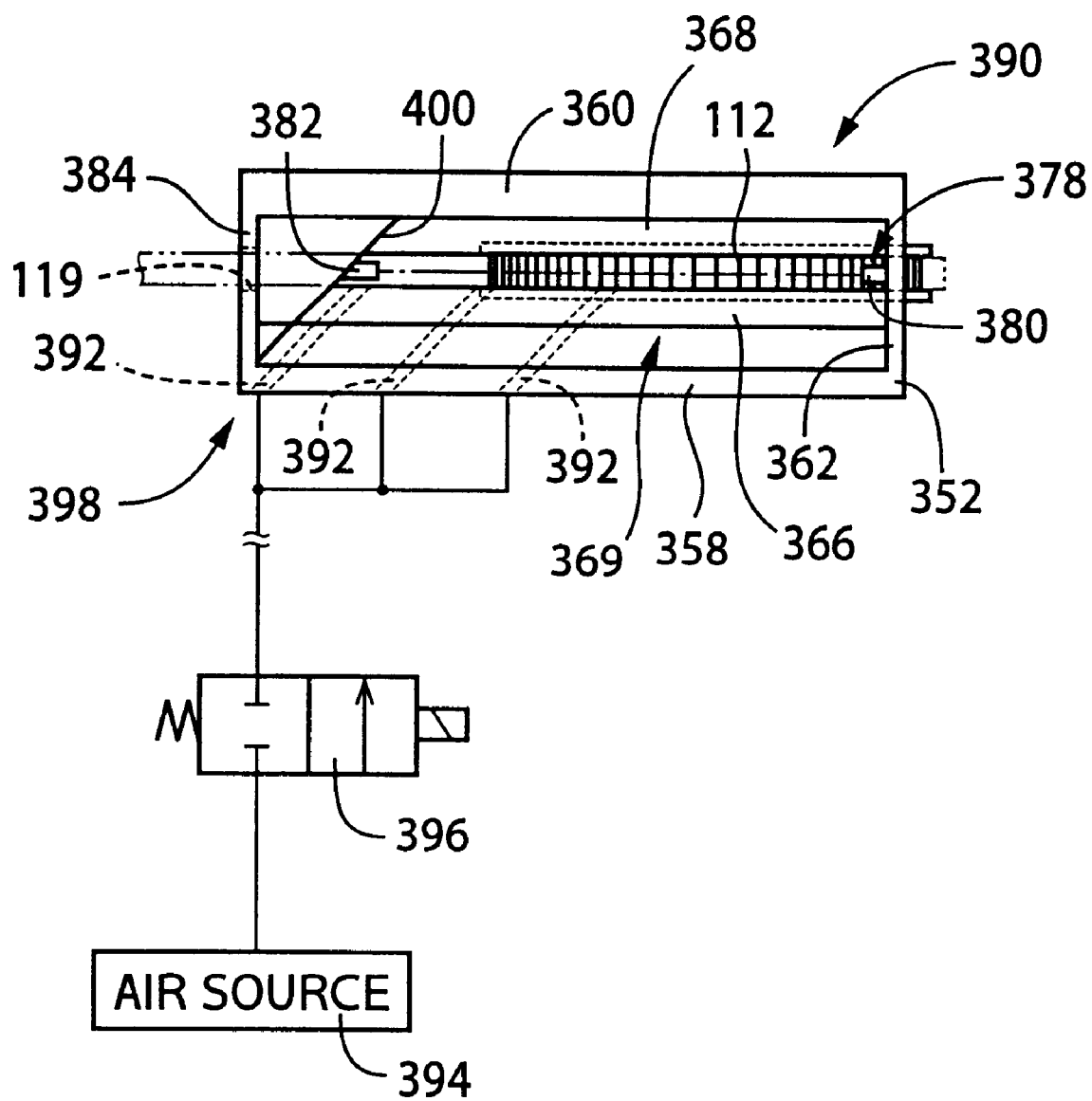
FIG. 18 is a plan view of a rotatable lifter and a clearing device of the EC feeder of FIG. 17.
Figure 19:
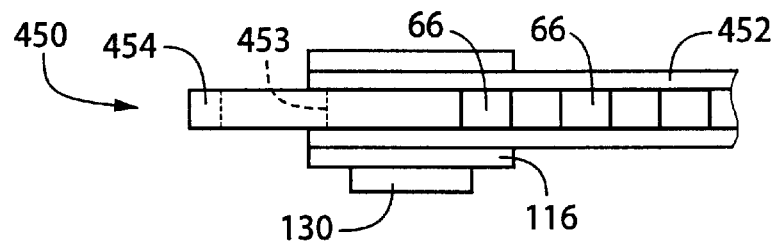
FIG. 19 is a plan view of another EC feeder as a seventh embodiment of the present invention.

In the fifth embodiment, the clearing device 370 includes the elastic clearing members 372. However, it is possible to employ a clearing device which blows an air flow to clear one or more ECs 66 which are not accommodated in the pockets 120 of the conveyor belt 118 and are present on the upper surface of the belt 118, as shown in FIGS. 17 and 18. FIGS. 17 and 18 show a sixth embodiment relating to an EC feeder 390 which does not employ an circulative lifter like the EC feeder 350 shown in FIGS. 14 to 16. The same reference numerals as used in the first and fifth embodiments shown in FIGS. 1 to 7 and FIGS. 14 to 16 are used to designate the corresponding elements and parts of the sixth embodiment.

The EC feeder 390 has a plurality of (e.g., three) air-blow holes 392 which are formed in the side wall 358 defining the EC-store room 356. The air-flow holes 392 are located at a height position slightly higher than the upper surface of the conveyor belt 118, such that the holes 392 are distant from each other in the EC-feed direction. One end of each of the air-blow holes 392 opens in the EC-store room 356, and the each hole 392 is inclined such that the air blown from the each hole 392 into the room 356 flows in a direction having a component from a downstream side of the each hole 392 toward an upstream side thereof as seen in the EC-feed direction. The other end of the each hole 392 is connected to an air source 394 and, when a solenoid-operated open/close valve 396 as a solenoid-operated control valve that is provided between the each hole 392 and the air source 394 is opened and closed, the air is blown into the room 356, or the blowing of the air is stopped. The open/close valve 396 is controlled by the control device 230 which controls the EC mounting machine. In the present embodiment, the air-blow holes 392 blow a dry air, and the air-blow holes 392, the air sources 394, the open/close valve 396 cooperate with one another to provide a clearing device 398. The side wall 384 which defines the EC-store room 356 and which is located on the downstream-side end of the housing 360 as viewed in the EC-feed direction, has a vertical inclined surface 400 which is inclined, as shown in FIG. 18, relative to the EC-feed direction to extend parallel to each of the air-blow holes 392.

When the inside pulley 112 is rotated and the ECs 66 are conveyed by the conveyor belt 118, the air-blow holes 392 continuously or continually (e.g., intermittently) blow air into the EC-store room 356. The three holes 392 may simultaneously blow the air, or may blow the air at different timings. One or more ECs 66 which are not accommodated in the pockets 120 of the belt 118 and are present on the upper surface of the belt 118 are blown off by the air and are cleared from the belt 118. Since the air-blow holes 392 are inclined relative to the EC-feed direction, the ECs 66 are blown toward the upstream side of the holes 392 as seen in the EC-feed direction, so that the ECs 66 are prevented from gathering at the outlet 119 of the belt 118. In addition, since the side wall 384 has the inclined surface 400, the air blown from the holes 392 are effectively flown toward the upstream side in the EC-feed direction and the ECs 66 are effectively blown off toward the upstream side.

The clearing device 398 may include, in addition to the air-blow holes 392 and the air source 394, the clearing arms 372 which are provided by the bar-like springs in the fifth embodiment shown in FIGS. 14 to 16.

The clearing device 370 employed in the fifth embodiment or the clearing device 398 employed in the sixth embodiment may be employed in any one of the first to fourth embodiments in which the circulative lifter 146, 242, 316 is employed.

Figure 20:
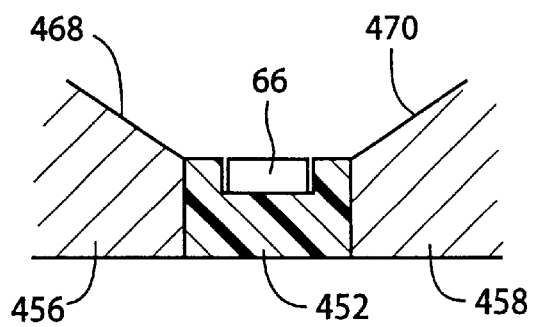
FIG. 20 is a transversely cross-sectioned side elevation view of a conveyor belt and side walls of a housing of the EC feeder of FIG. 19, taken at a position near an inside pulley of the feeder.

FIGS. 19, 20, 21, and 22 show a seventh embodiment relating to an EC feeder 450 including a synthetic-resin conveyor belt 452 in place of the conveyor belt 118 employed in the first embodiment. The conveyor belt 452 does not have any pockets like the pockets 120 of the belt 118, but has an elongate groove 453 whose depth is substantially equal to the height of each of the ECs 66 and whose width is slightly greater than that of each EC 66, as shown in FIG. 20.

Figure 21:
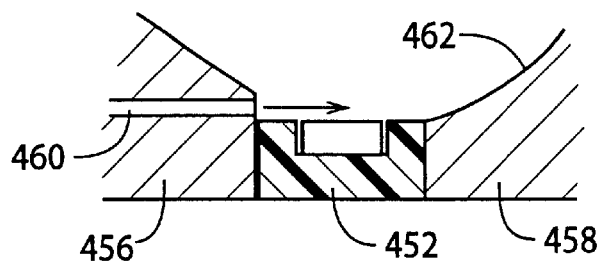
FIG. 21 is another transversely cross-sectioned side elevation view of the conveyor belt and the side walls of the EC feeder of FIG. 19, taken at a position near an outlet of a housing of the feeder.
Figure 22:
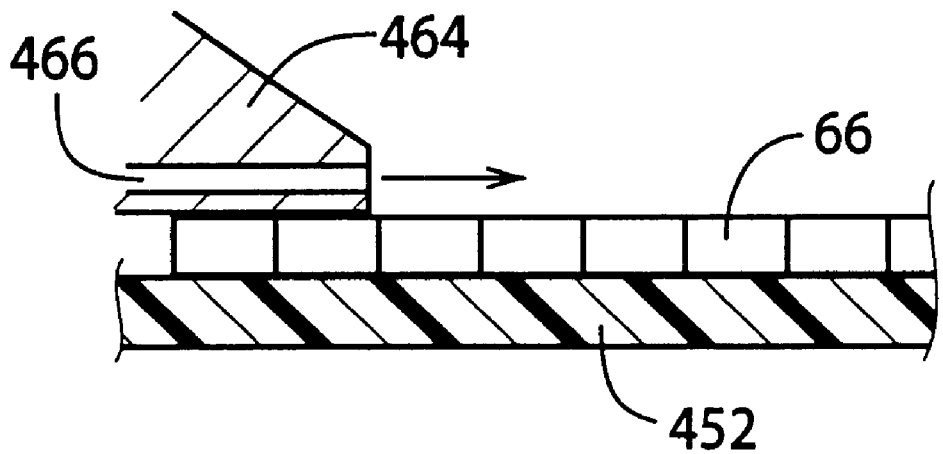
FIG. 22 is a longitudinally cross-sectioned side elevation view of the conveyor belt and a third side wall of the housing of the EC feeder of FIG. 19.

The EC feeder 450 includes a housing having two side walls 456, 458 which are opposed to each other in a direction perpendicular to the EC-feed direction, as shown in FIGS. 20 and 21, and a front side wall 464 having an outlet 119 (not shown in FIG. 22) through which the belt 452 goes out of the housing. The two side walls 456, 464 have respective an air-blow holes 460, 466 which are connected to an air source via a solenoid-operated open/close valve like those 394, 396 employed in the sixth embodiment. The air-blow hole 460 blows air toward ECs 66 which are inappropriately placed on an upper surface of the belt 452, or in the groove 453 of the belt 452, thereby blowing the ECs 66 off the belt 452, along a curved surface 462 of the wise wall 458. However, ECs 66 which are appropriately placed in the groove 452 are not influenced by the air blown from the hole 460, and are not blown off out of the groove 453. Some of the ECs 66 which are blown off by the air may be appropriately placed in the groove 453, but others may not. Thus, the ECs 66 are appropriately placed in the groove 453, little by little.

In the case where an EC 66 is inappropriately placed in the groove 453 such that the EC 66 takes an upright posture, i.e., lies on its side, the EC 66 may not be blown off by the air supplied from the air-blow hole 460 of the side wall 456. In this case, however, the air-blow hole 466 of the front side wall 464 blows the EC 66 in an upstream direction as seen in the EC-feed direction, thereby clearing the EC 66 out of the groove 453. The thus blown-off EC 66 may, or may not, be appropriately placed in a portion of the groove 453 that is distant from the hole 466. The two side walls 456, 458 have respective inclined surfaces 468, 470 which function as guide surfaces which guide the ECs 66 supplied from the EC-case 68 toward the groove 453 of the belt 452.

The EC feeder 450 additionally has a stopper member 454 which is supported by a support member (not shown) fixed to the housing. When the outside pulley 116 is rotated forward, the ECs 66 which are appropriately accommodated in the groove 453 of the conveyor belt 452 are moved with the belt 452, and the leading one of the ECs 66 is stopped by the stopper member 454. Then, the pulley 116 is rotated backward by a small angle and the belt 452 is moved backward by a corresponding small distance, so that the leading EC 66 is moved away from the stopper member 454 and is taken out by the EC-suck head 22. Since the ECs 66 collide with the stopper member 454, spaces which may possibly be left among the ECs 66 in the EC-feed direction are completely eliminated before the ECs 66 reach the EC-supply position where each EC 66 is taken out by the head 22. Thus, each EC 66 which takes its appropriate posture, i.e., lies on its back in the groove 453 is taken out by the head 22.

Figure 23:
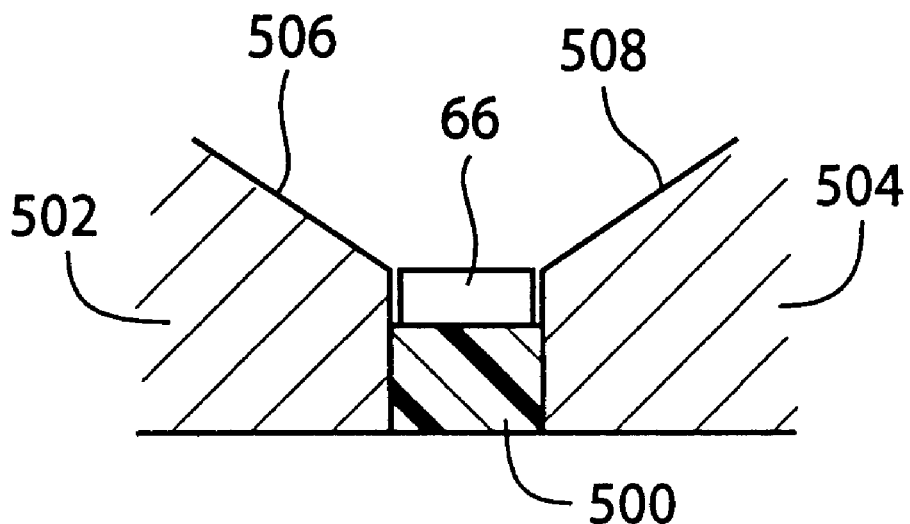
FIG. 23 is a transversely cross-sectioned side elevation view of another EC feeder as an eighth embodiment of the present invention.

However, the conveyor belt need not have a pocket or a groove. FIG. 23 shows an eighth embodiment relating to an EC feeder which employs a flat conveyor belt 500 which has no pocket or groove. The EC feeder includes a housing including two side walls 502, 504 having respective inclined surfaces 506, 508 which function as guide surfaces for guiding the ECs 66 toward an upper surface of the belt 500 and which cooperate with each other to define a groove whose bottom surface is defined by the upper surface of the belt 500, whose depth is substantially equal to the height of each EC 66, and whose width is slightly greater than the width of each EC 66. FIG. 23 shows a cross-section view taken at a position corresponding to the position at which the cross-section view of FIG. 20 is taken. The other features of the eighth embodiment are the same as those of the seventh embodiment shown in FIGS. 19 to 22.

In each of the first and second embodiments, the movable clearing device 172 has the inclined surfaces 184, 186 which function as both the guide surfaces and the clearing surfaces. However, the part-annular portion 180 and the linear portion 182 of the clearing member 172 may have respective vertical surfaces which are formed at respective ends of the inclined surfaces 184, 186 that are located on the side of the conveyor belt 118, and which function as clearing surfaces.

In the third embodiment, the stationary clearing member 264 has the inclined clearing surface 266. However, it is not essentially required that a stationary clearing member have an inclined clearing surface. That is, a stationary clearing member may have, as its clearing surface, a plane surface which is perpendicular to the EC-feed direction.

In each of the first to third embodiments, the rotatable lifter. 146 has, as its holders, the blades 166 or the buckets 250 that scoop and convey the ECs 66. However, the rotatable lifter 146 may have, as its holders, holding members each of which is moved by a holding-member drive device, to an EC-release position where the each holding member releases the EC 66 and to an EC-hold position where the each holding member holds the EC 66. In this case, the drive device may be one which includes a cam device including a cam provided on the housing and a cam follower provided on each holding member, and a biasing device for biasing the each holding member toward its EC-hold position. When the rotatable lifter 146 is rotated and each holding member is moved to a predetermined angular position, the cam device moves the each holding member to its EC-release position so that the each holding member releases the EC 66; and, after the releasing of the EC 66, the biasing device returns the each holding member to its EC-hold position. Thus, each holding member releases an EC 66 at the predetermined angular position where the cam is provided.

The number of the blades 166 as the holders or the rollers 200 as the cam followers is not limited to four, but may be greater. In addition, the respective numbers of the blades 166 and the rollers 200 need not be equal to each other, that is, may be different from each other. These are true with the case where the buckets 250 are employed as the holders. In each other, the timing at which each blade releases an EC 66 is made different from that at which each roller 200 engages the cam 196, as described in the first and second embodiments.

In the fifth embodiment shown in FIGS. 14 to 16, the EC reservoir 364 is defined by the curving of the outer circumference of the inside pulley 112. Otherwise, it is possible that the conveyor belt 118 be wound on three or more rollers so that a portion of the belt 118 linearly extends and is inclined such that the portion slopes upward as seen in the EC-feed direction. In this case, an EC reservoir may be provided by a space defined by, and between, the inclined portion and the side wall 362 of the housing 352.

In each of the first to fourth embodiments shown in FIGS. 1 to 13, the conveyor belt 118 may be circulated by using three or more pulleys.

In each of all the illustrated embodiments, the escape-member drive device 78 is provided by the rotary solenoid. However, it is possible to employ, as a drive source of the escape-member drive device, an electric rotary motor as a sort of electric motor, or a swinging cylinder device as a sort of pressurized-fluid-operated actuator.

In each of the illustrated embodiments shown in FIGS. 1 to 18, the depth of each of the pockets 120 of the conveyor belt 118 is equal to the height of each of the ECs 66 as objects to be supplied. However, this is not essentially required. The depth of each pocket 120 may be greater than the height of each EC 66. In this case, the EC 66 which rides on the EC 66 accommodated in the pocket 120 and accordingly is partly accommodated in the pocket 120 can be cleared from the conveyor belt 118 by a movable clearing member such as the member 172. Since the movable clearing member 172 has the inclined surfaces 184, 186 functioning as both the guide surfaces and the clearing surfaces, the clearing member 172 can easily remove the EC 66 out of the pocket 120. In the case where the opening of each pocket 120 is chamfered, the EC 66 can be more easily removed out of the pocket 120.

In each of the illustrated embodiments, the conveyor belt 118 is formed of steel. However, the belt 118 may be formed of a high-molecular compound such as synthetic resin or rubber.

In each of the embodiments shown in FIGS. 1 to 10, the rotatable lifter 146 may employ, as its holders, permanent magnets; and in the embodiment shown in FIGS. 11 to 13, the belt lifter 316 may employ, as its holders, blades or buckets.

In the embodiment, shown in FIGS. 11, in which the belt lifter 316 is employed in place of the rotatable lifter 146, the clearing device may be one which includes a movable clearing member.

In each of the embodiments shown in FIGS. 1 to 8, the cam of the cam device as the clearing-related drive device may be provided on the rotatable lifter 146, and the cam follower of the same may be provided on the movable clearing device 172.

In each of the illustrated embodiments, the EC feeder 12, 240, 260, 300, 350, 390 is one which supplies ECs 66 to an EC mounting system 14 including an index table 20 which includes a plurality of EC-suck heads 22 and which is revolved about an axis line so that the heads 22 suck and hold the ECs 66 and mount the ECs 66 on a printed-wiring board 18. However, the principle of the present invention may be applied to an EC feeder which supplies ECs to an EC mounting system which linearly moves an EC-suck head in one direction to suck and mount ECs, or an EC mounting system which linearly moves an EC-suck head in two directions perpendicular to each other on a reference plane to suck and mount ECs. Depending upon the specific construction of an EC mounting system with which an EC feeder is used, the EC feeder may be one which is linearly moved by a movable table in one direction, as described in the first embodiment, one which is moved in two directions perpendicular to each other on a reference plane, or one which is stationary, i.e., is fixed at a position where it supplies ECs. Thus, each EC mounting system can be called as an EC taking-out system or an EC transferring system.

In addition, the principle of the present invention may be applied not only an EC feeder but also an object supplying device which supplies objects other than ECs.

While the present invention has been described in its preferred embodiments, the present invention is not limited to the features described in SUMMARY OF THE INVENTION and the features described in PREFERRED EMBODIMENTS OF THE INVENTION and may be embodied with other changes, improvements, and modifications that may occur to a person skilled in the art without departing from the scope and spirit of the invention defined in the appended claims.

What is claimed is:

1. An object supplying apparatus, comprising:
   a housing;
   a plurality of pulleys which are rotatable about respective substantially horizontal axis lines and at least one of which is provided in the housing;
   a conveyor belt which has a plurality of pockets provided in a surface thereof and arranged in a lengthwise direction thereof, and which is wound on the pulleys such that a portion of the belt extends in a substantially horizontal direction and the pockets provided in said portion of the belt open upward;
   a circulative lifter which is circulated on a substantially vertical plane in the housing, and which has at least one holder which holds at least one of a plurality of objects present in a lower portion of the housing, conveys the object upward, and releases the object at an object-release position in the housing;
   a guide device which is provided below the object-release position and which guides the object toward said portion of the conveyor belt; and
   a clearing device which clears, from said portion of the conveyor belt, the object which has not been accommodated in any of the pockets of said portion of the belt and is present on said portion of the belt.

2. An apparatus according to claim 1, wherein a first one of the plurality of pulleys is provided inside the housing and a second one of the pulleys is provided outside the housing, and wherein said portion of the conveyor belt extends in the substantially horizontal direction between the first and second pulleys.

3. An apparatus according to claim 1, wherein the circulative lifter comprises a rotatable lifter which is rotatable about a substantially horizontal axis line and which has a plurality of said holders in an outer peripheral portion thereof such that the holders are angularly spaced from each other about the horizontal axis line.

4. An apparatus according to claim 3, wherein the rotatable lifter comprises a rotatable drum including a circular portion and a cylindrical portion extending from an outer circumferential edge of the circular portion in a direction substantially perpendicular thereto, and wherein the holders are supported by an inner circumferential surface of the cylindrical portion of the rotatable drum.

5. An apparatus according to claim 4, wherein the plurality of holders comprises a plurality of blades which extend inward from the inner circumferential surface of the cylindrical portion of the rotatable drum.

6. An apparatus according to claim 3, wherein the rotatable lifter is concentric with said one of the pulleys that is provided in the housing.

7. An apparatus according to claim 1, wherein the clearing device comprises a clearing member which engages the object present on said portion of the conveyor belt and thereby clears the object from said portion of the belt.

8. An apparatus according to claim 7, wherein the clearing device further comprises a clearing-related drive device which moves the clearing member to a clearing position thereof above said portion of the conveyor belt and to a retracted position thereof away from the clearing position.

9. An apparatus according to claim 7, wherein the guide device comprises a guide member having an inclined guide surface which is inclined such that a lower portion of the inclined guide surface is nearer to said portion of the Conveyor belt than an upper portion of the inclined guide surface, and wherein the guide member provides the clearing member.

10. An apparatus according to claim 9, wherein the clearing device further comprises a clearing-related drive device which moves the guide member to a clearing position thereof above said portion of the conveyor belt and to a retracted position thereof away from the clearing position.

11. An apparatus according to claim 8, wherein the clearing-related drive device comprises a cam device including a cam which is attached to one of the rotatable lifter and the clearing member and a cam follower which is attached to the other of the rotatable lifter and the clearing member, and wherein when the rotatable lifter is rotated, the cam and the cam follower engage each other and thereby moves the clearing member to the clearing position thereof.

12. An apparatus according to claim 11, wherein the clearing-related drive device further comprises a biasing device which applies a biasing force to the clearing member to move the clearing member toward the retracted position thereof, and wherein the cam device moves the clearing member to the clearing position thereof against the biasing force of the biasing device.

13. An apparatus according to claim 1, wherein the housing comprises a case attaching device which can attach an object case in which a plurality of objects are stored, to the housing, such that the object case is detachable from the housing.

14. An apparatus according to claim 13, further comprising a constant-amount supplying device which is operable such that each time the supplying device is operated, the supplying device supplies a substantially constant amount of objects from the object case to the housing.

15. An apparatus according to claim 13, wherein the case attaching device is provided in a top portion of the housing, and wherein the apparatus further comprises an object-amount control device which is provided below the case attaching device and which allows, each time the control device is operated, a substantially constant amount of objects to be supplied from the object case to the housing.

16. An apparatus according to claim 15, wherein the object-amount control device comprises:
   an upper shutter member which is provided in a communication passage connecting between an inner space of the object case and an inner space of the housing and which is movable to a shutting position thereof where the upper shutter member shuts the communication passage and to an opening position thereof where the upper shutter member opens the communication passage;
   a lower shutter member which is provided below the upper shutter member in the communication passage and which is movable to a shutting position thereof where the lower shutter member shuts the communication passage and to an opening position thereof where the lower shutter member opens the communication passage; and
   a shutter-member drive device which alternately moves each of the upper and lower shutter members to the shutting and opening positions thereof.

17. An apparatus according to claim 16, wherein the object-amount control device comprises an escape member which is pivotable about a substantially horizontal axis line and which includes an upper end portion providing the upper shutter member and a lower end portion providing the lower shutter member, and wherein the shutter-member drive device comprises an escape-member drive device which pivots the escape member about the horizontal axis line.

18. An apparatus according to claim 16, wherein the upper and lower shutter members are formed of an elastic material which is softer than the objects.

19. An apparatus according to claim 1, further comprising an object-amount-shortage detector which detects that an amount of the objects present in the housing is not greater than a predetermined amount.

20. An apparatus according to claim 19, wherein the housing comprises a case attaching device which can attach an object case in which a plurality of objects are stored, to the housing, such that the object case is detachable from the housing, wherein the apparatus further comprises an object-amount control device which is provided below the case attaching device and which allows, each time the control device is operated, a substantially constant amount of objects to be supplied from the object case to the housing, and wherein the object-amount-shortage detector comprises an object-amount sensor which is provided at a reference position higher than a bottom surface of the housing and which produces a first signal when at least one object is present at the reference position and produces a second signal different from the first signal when no object is present at the reference position; and an object-amount-control-device control device which operates the object-amount-control device when the object-amount sensor continues producing the second signal for not less than a reference time.

21. An apparatus according to claim 1, wherein the pockets of the conveyor belt are formed at a predetermined pitch in the lengthwise direction of the belt, and wherein the apparatus further comprises a belt drive device which rotates one of the pulleys at a predetermined angular pitch corresponding to the predetermined pitch at which the pockets are formed.

22. An apparatus according to claim 1, further comprising:
an object sensor which is provided at an object-detect position in a vicinity of said portion of the conveyor belt, and which produces a first signal when the object sensor detects an object present in the pocket being positioned at the object-detect position, and produces a second signal different from the first signal when the object sensor detects no object in the pocket being positioned at the object-detect position; and
a belt-drive-device control device which stops the belt drive device when, after the object sensor has produced the first signal, the pocket accommodating the object detected by the object sensor has reached an object-supply portion of the apparatus from which the apparatus supplies the objects one by one, and which continues operating the belt drive device when, after the object sensor has produced the second signal, the pocket in which no object has been detected by the object sensor has reached the object-supply portion.

23. An apparatus according to claim 1, wherein each of the objects is a leadless electric component having no lead.

24. An object supplying apparatus, comprising:
a housing which has, in a top portion thereof, a case attaching device which can attach an object case in which a plurality of objects are stored, to the top portion thereof, such that the object case is detachable from the housing;
an object-amount control device which is provided below the case attaching device and which allows, each time the control device is operated, a substantially constant amount of objects to be supplied from the object case to the housing;
a plurality of pulleys which are rotatable about respective substantially horizontal axis lines and at least one of which is provided in the housing;
a conveyor belt which has a plurality of pockets provided in a surface thereof and arranged in a lengthwise direction thereof, and which is wound on the pulleys such that a portion of the belt extends in a substantially horizontal direction and the pockets provided in said portion of the belt open upward;
a guide device which guides at least one of the objects toward said portion of the conveyor belt; and
a clearing device which clears, from said portion of the conveyor belt, the object which has not been accommodated in any of the pockets of said portion of the belt and is present on said portion of the belt.

25. An object supplying apparatus, comprising:
a housing;
an object supplier which is provided above the housing, which stores a plurality of objects, and which supplies the objects to the housing;
an object-amount control device which is provided between the housing and the object supplier and which allows, each time the control device is operated, a substantially constant amount of objects to be supplied from the object supplier to the housing;
a plurality of pulleys which are rotatable about respective substantially horizontal axis lines and at least one of which is provided in the housing;
a conveyor belt which has a plurality of pockets provided in a surface thereof and arranged in a lengthwise direction thereof, and which is wound on the pulleys such that a portion of the belt extends in a substantially horizontal direction and the pockets provided in said portion of the belt open upward;
a guide device which guides at least one of the objects toward said portion of the conveyor belt; and
a clearing device which clears, from said portion of the conveyor belt, the object which has not been accommodated in any of the pockets of said portion of the belt and is present on said portion of the belt.

26. An object supplying apparatus, comprising:
a housing;
an object supplier which is provided above the housing, which stores a plurality of objects, and which supplies the objects to the housing;
an object-amount control device which is provided between the housing and the object supplier and which allows, each time the control device is operated, a substantially constant amount of objects to be supplied from the object supplier to the housing;
a plurality of pulleys which are rotatable about respective substantially horizontal axis lines and at least one of which is provided in the housing;
a conveyor belt which is wound on the pulleys such that a portion of the belt extends in a substantially horizontal direction;
a guide device which guides the objects toward said portion of the conveyor belt; and
a clearing device which clears, from said portion of the conveyor belt, the object which has been inappropriately placed on said portion of the belt.

27. An apparatus according to claim 26, wherein the conveyor belt has a groove extending in a lengthwise direction thereof in an outer surface thereof, and wherein the guide device guides the objects toward the groove of said portion of the conveyor belt.

28. An apparatus according to claim 26, wherein the guide device guides the objects toward an upper surface of said portion of the conveyor belt.

29. An apparatus according to claim 26, wherein the clearing device comprises an air-blow device which blows air toward the inappropriately placed object, thereby clearing the object from said portion of the conveyor belt.

* * * * *